(12) United States Patent
Nomura

(10) Patent No.: US 10,488,760 B2
(45) Date of Patent: Nov. 26, 2019

(54) METHOD FOR ACQUIRING PARAMETER FOR DOSE CORRECTION OF CHARGED PARTICLE BEAM, CHARGED PARTICLE BEAM WRITING METHOD, AND CHARGED PARTICLE BEAM WRITING APPARATUS

(71) Applicant: NuFlare Technology, Inc., Yokohama-shi (JP)

(72) Inventor: Haruyuki Nomura, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 16/111,732

(22) Filed: Aug. 24, 2018

(65) Prior Publication Data

US 2019/0004429 A1 Jan. 3, 2019

Related U.S. Application Data

(62) Division of application No. 15/342,234, filed on Nov. 3, 2016, now Pat. No. 10,114,290.

(30) Foreign Application Priority Data

Nov. 18, 2015 (JP) ................. 2015-225453

(51) Int. Cl.
| | |
|---|---|
| *G03F 7/20* | (2006.01) |
| *H01J 37/31* | (2006.01) |
| *H01J 37/04* | (2006.01) |
| *H01J 37/304* | (2006.01) |
| *H01J 37/317* | (2006.01) |

(52) U.S. Cl.
CPC ........ *G03F 7/2061* (2013.01); *G03F 7/70516* (2013.01); *H01J 37/045* (2013.01); *H01J 37/304* (2013.01); *H01J 37/31* (2013.01); *H01J 37/3174* (2013.01); *H01J 2237/30455* (2013.01); *H01J 2237/31769* (2013.01)

(58) Field of Classification Search
CPC .... G03F 7/2061; G03F 7/70516; H01J 37/31; H01J 37/045; H01J 37/304; H01J 37/3174
USPC .......................................... 430/30, 296, 942
See application file for complete search history.

(56) References Cited

U.S. PATENT DOCUMENTS

| | | |
|---|---|---|
| 2009/0032739 A1 | 2/2009 | Kawase |
| 2012/0068089 A1 | 3/2012 | Nakayamada et al. |
| 2013/0316288 A1 | 11/2013 | Nakayamada |
| 2014/0291553 A1 | 10/2014 | Nakayamada et al. |

FOREIGN PATENT DOCUMENTS

| | | |
|---|---|---|
| JP | 2009-33025 A | 2/2009 |
| JP | 2012-69675 | 4/2012 |
| JP | 2014-209599 | 11/2014 |
| KR | 10-2013-0130638 A | 12/2013 |
| TW | 201411291 A | 3/2014 |

OTHER PUBLICATIONS

Korean Office Action dated Oct. 10, 2017 in Patent Application No. 10-2016-0153930 (with English Translation).
Combined Office Action and Search Report dated Dec. 21, 2017 in Taiwanese Patent Application No. 105135750 with English translation, 11 pages.
Office Action dated Apr. 12, 2018 in Taiwanese Patent Application No. 105135750 with English translation.
Office Action issued Jul. 30, 2019, in Japanese Patent Application No. 2015-225453 dated Nov. 18. 2015, w/English-language Translation.

*Primary Examiner* — Christopher G Young
(74) *Attorney, Agent, or Firm* — Oblon, McClelland, Maier & Neustadt, L.L.P.

(57) ABSTRACT

A parameter acquiring method for dose correction of a charged particle beam includes writing evaluation patterns on a substrate coated with resist; writing, while varying writing condition, a peripheral pattern on a periphery of any different one of the evaluation patterns, after an ignorable time as to influence of resist temperature increase due to writing of an evaluation pattern concerned has passed; and calculating a parameter for defining correlation among a width dimension change amount of the evaluation pattern concerned, a temperature increase amount of the evaluation pattern concerned, and a backscatter dose reaching the evaluation pattern concerned, by using, under each writing condition, a width dimension of the evaluation pattern concerned, the temperature increase amount of the evaluation pattern concerned at each shot time, and the backscatter dose reaching the evaluation pattern concerned from each shot.

3 Claims, 18 Drawing Sheets

When writing CD measurement position after writing peripheral part, the following ...

When writing CD measurement position after writing peripheral part, the following ...

Writing Using One Chip

Variably Change Settling

BETA

Measured CD Dimension

Writing Using Two Chips

Measured CD Dimension

Backscatter dose $d_j$ by $j$-th shot,
at position $(x_i, y_i)$ of target shot position $i$

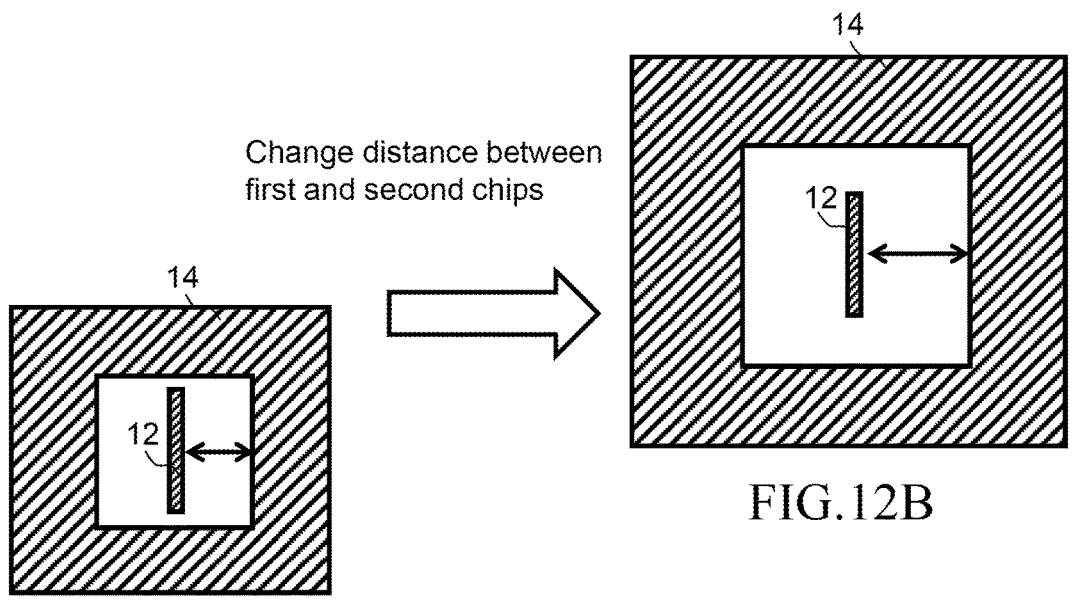
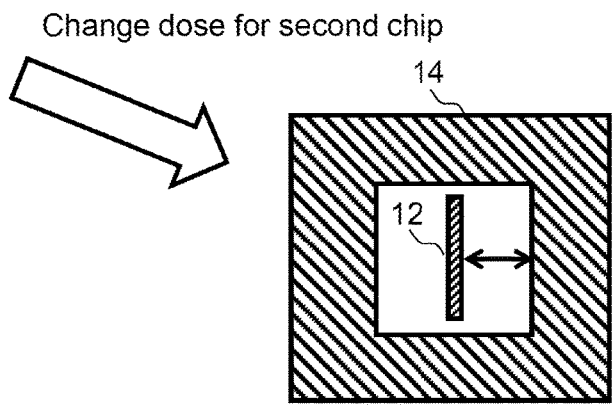
FIG.12A
FIG.12B
FIG.12C
Change distance between first and second chips
Change dose for second chip

First Chip
Fixed settling time

Second Chip :
Change heating effect
by variably changing settling time, etc.

Writing Using One Chip

Writing Using Two Chips

Resist A
23.5 [uC/cm²]
3 pass

Resist B
15.1 [uC/cm²]
2 pass

Resist C
6.4 [uC/cm²]
1 pass

METHOD FOR ACQUIRING PARAMETER FOR DOSE CORRECTION OF CHARGED PARTICLE BEAM, CHARGED PARTICLE BEAM WRITING METHOD, AND CHARGED PARTICLE BEAM WRITING APPARATUS

CROSS-REFERENCE TO RELATED APPLICATION

This application is a Divisional of U.S. application Ser. No. 15/342,234 filed on Nov. 3, 2016, is based upon and claims the benefit of priority from the prior Japanese Patent Application No. 2015-225453 filed on Nov. 18, 2015 in Japan, the entire contents of each of which are incorporated herein by reference.

BACKGROUND OF THE INVENTION

Field of the Invention

Embodiments of the present invention relate generally to a method for acquiring a parameter for correcting a dose of a charged particle beam, a charged particle beam writing method, and a charged particle beam writing apparatus. More specifically, embodiments of the present invention relate, for example, to an apparatus and method that correct resist heating.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

FIG. 18 is a conceptual diagram explaining operations of a variable-shaped electron beam writing or "drawing" apparatus. The variable-shaped electron beam writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., x direction) during writing. In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

With development of the optical lithography technology and shorter wavelengths due to EUV (extreme ultraviolet), the number of electron beam shots required for mask writing is acceleratedly increasing. On the other hand, for ensuring the line width accuracy needed for micropatterning, it is aimed to reduce shot noise and pattern edge roughness by making resist less sensitive and increasing the dose. Since the number of shots and the amount of dose increase limitlessly, the pattern writing time also increases limitlessly. Therefore, it is now considered/examined to reduce the writing time by increasing the current density.

However, if the substrate is irradiated with an increased amount of irradiation energy as higher density electron beams in a short time, another problem occurs in that the substrate overheats resulting in a phenomenon called "resist heating" of changing the resist sensitivity and degrading the line width accuracy. To solve this problem, there is considered and examined a method (heating correction) of calculating, for each minimum deflection region in a deflection region, a representative temperature of the minimum deflection region concerned based on heat transfer from other minimum deflection regions written prior to the current one, and of modulating the dose by using the representative temperature (refer to Japanese Patent Application Laid-open (JP-A) No. 2012-069675).

On the other hand, in the electron beam writing, when writing a circuit pattern by irradiating a mask, coated with resist, with electron beams, a phenomenon called a "proximity effect" occurs due to backscattering of the electron beams penetrating the resist film, reaching the layer thereunder to be reflected, and entering the resist film again. Thereby, a dimensional change occurs, that is, a written pattern is deviated from a desired dimension. In order to avoid this phenomenon, a proximity effect correction operation that suppresses such dimensional change by modulating the dose is for example performed in the writing apparatus.

The dose modulation against the resist heating described above is performed in consideration of the temperature at the time of an electron beam shot of interest (target shot, shot concerned). Therefore, temperature is not considered with respect to calculation for correcting the proximity effect generated by backscattering by another shot at the peripheral position different from that of the shot of interest (target shot). Accordingly, when the heating effect of the backscatter is large, there is a problem in that the correction error is large in the conventional calculation model. Therefore, it is desirable to correct the heating effect with respect to a backscattered electron at the time of exposure. However, conventionally, a sufficient correction method has not been established.

BRIEF SUMMARY OF THE INVENTION

According to one aspect of the present invention, a method for acquiring a parameter for correcting a dose of a charged particle beam includes writing, using a charged particle beam, a plurality of evaluation patterns on a substrate coated with resist; writing, under each writing condition while varying writing condition for each of the plurality of evaluation patterns, a peripheral pattern according to a corresponding writing condition on a periphery of any different one of the plurality of evaluation patterns by using a plurality of shots of the charged particle beam, after time that can be disregarded with respect to influence of temperature increase of the resist due to writing of an evaluation pattern concerned of the plurality of evaluation patterns has passed; measuring, under the each writing condition, a width dimension of the evaluation pattern concerned, on whose periphery the peripheral pattern has been written; calculating, under the each writing condition, a backscatter dose reaching the evaluation pattern concerned from each shot of the plurality of shots; calculating, under the each writing condition, a temperature increase amount of the evaluation pattern concerned, which is increased due to heat transferred from at least one shot previous to a shot concerned in the plurality of shots, at each shot time of the plurality of shots; and calculating a correlation parameter for defining a correlation among a width dimension change amount of the evaluation pattern concerned, the temperature increase amount of the evaluation pattern concerned, and the backscatter dose reaching to the evaluation pattern concerned, by using a width dimension of the evaluation pattern concerned under the each writing condition, the temperature increase amount of the evaluation pattern concerned at the each shot time under the each writing condition, and the backscatter dose reaching the evaluation pattern concerned from the each shot under the each writing condition, and outputting the correlation parameter.

According to another aspect of the present invention, a charged particle beam writing method includes extracting information on a type of resist coated on a writing target substrate; reading out a corresponding correlation parameter which corresponds to the resist of an extracted type from a storage device which stores, for each type of the resist, a correlation parameter for a width dimension change amount of a figure pattern, a temperature increase amount of the figure pattern, and a backscatter dose reaching the figure pattern, and calculating the width dimension change amount of the figure pattern by using the correlation parameter when writing the figure pattern under a predetermined writing condition by using a charged particle beam; determining, using the width dimension change amount, whether it is necessary to correct a dose of the charged particle beam when writing, under the predetermined writing condition, the figure pattern by using the charged particle beam; calculating a correction coefficient for correcting the dose of the charged particle beam for writing the figure pattern when it is determined that correction of the dose is needed; correcting, using the correction coefficient, the dose of the charged particle beam for writing the figure pattern; and writing, under the predetermined writing condition, the figure pattern on the writing target substrate by using the charged particle beam of the dose having been corrected.

According to yet another aspect of the present invention, a charged particle beam writing apparatus includes an extraction processing circuitry configured to extract information on a type of resist coated on a writing target substrate; a storage device configured to store, for each type of the resist, a correlation parameter for a width dimension change amount changed from a design dimension of a figure pattern, a temperature increase amount of the figure pattern, and a backscatter dose reaching the figure pattern; a width dimension change amount calculation processing circuitry configured to read out a corresponding correlation parameter which corresponds to an extracted type of the resist from the storage device, and to calculate the width dimension change amount of the figure pattern by using the correlation parameter in a case of writing the figure pattern under a predetermined writing condition by using a charged particle beam; a determination processing circuitry configured to determine, using the width dimension change amount, whether it is necessary to correct a dose of the charged particle beam in the case of writing, under the predetermined writing condition, the figure pattern by using the charged particle beam; a correction coefficient calculation processing circuitry configured to calculate a correction coefficient for correcting the dose of the charged particle beam for writing the figure pattern in a case where it is determined that correction of the dose is needed; a correction processing circuitry configured to correct, using the correction coefficient, the dose of the charged particle beam for writing the figure pattern; and a writing mechanism configured to include a stage for mounting the writing target substrate thereon, an emission source for emitting charged particle beams, and a deflector for deflecting the charged particle beams, and to write, under the predetermined writing condition, the figure pattern on the writing target substrate by using the charged particle beam of the dose having been corrected.

BRIEF DESCRIPTION OF THE DRAWINGS

FIGS. 12A to 12C show another example of an evaluation pattern and a peripheral pattern according to the first embodiment;

DETAILED DESCRIPTION OF THE INVENTION

An embodiment of the present invention provides a method of acquiring a parameter for performing dose correction for heating effect of backscatter, or an apparatus and method that can perform writing after correcting the dose by using such a parameter.

In the embodiments below, there will be described a configuration in which an electron beam is used as an example of a charged particle beam. The charged particle beam is not limited to the electron beam, and other charged particle beam such as an ion beam may also be used. Moreover, a writing apparatus of a variably shaped beam type will be described as an example of a charged particle beam apparatus.

First Embodiment

Figure 1:
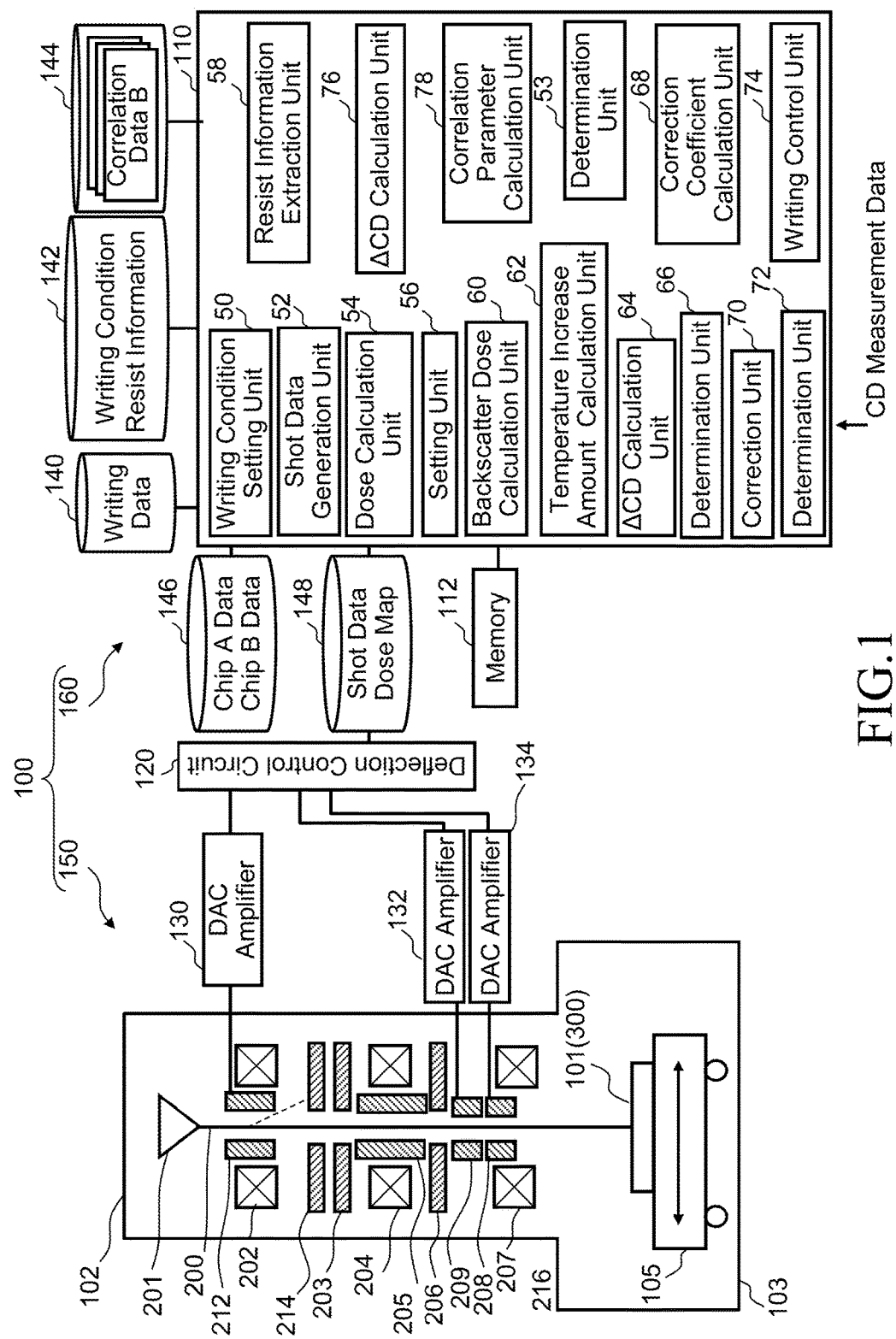
FIG. 1 is a conceptual diagram showing a configuration of a writing apparatus according to a first embodiment.

FIG. 1 is a conceptual diagram showing a configuration of a writing apparatus according to the first embodiment. As shown in FIG. 1, a writing apparatus 100 includes a writing unit 150 and a control unit 160. The writing apparatus 100 is an example of a charged particle beam writing apparatus. Particularly, it is an example of a writing apparatus of a variably shaped beam (VSB) type. The writing unit 150 includes an electron optical column 102 and a writing chamber 103. In the electron optical column 102, there are arranged an electron gun 201, an illumination lens 202, a blanking deflector (blanker) 212, a blanking aperture member 214, a first shaping aperture member 203, a projection lens 204, a deflector 205, a second shaping aperture member 206, an objective lens 207, a main deflector 208, and a sub deflector 209. In the writing chamber 103, there is arranged an XY stage 105 which is movable at least in the x-y directions. On the XY stage 105, there is placed a target object or "sample" 101 (substrate) which serves as a writing target coated with resist. The target object 101 may be an exposure mask, a silicon wafer, and the like used for manufacturing semiconductor devices. Alternatively, on the XY stage 105, there is placed an evaluation substrate 300 (substrate) which serves as an evaluation target coated with resist. The evaluation substrate 300 may be an exposure mask, a silicon wafer, and the like. The mask may be a mask blank. On the glass substrate of the mask blank, a light-shielding film of such as chromium (Cr), and a resist film are laminated in this order. A plurality of evaluation substrates 300 whose resist types are different are used.

The control unit 160 includes a control computer unit 110, a memory 112, a deflection control circuit 120, DAC (digital-analog converter) amplifier units 130, 132 and 134 (deflection amplifiers), and storage devices 140, 142, 144, 146, and 148 such as magnetic disk drives. The control computer unit 110, the deflection control circuit 120, and the storage devices 140, 142, 144, 146, and 148 are connected with each other through a bus (not shown). The DAC amplifier units 130, 132, and 134 are connected to the deflection control circuit 120. The DAC amplifier unit 130 is connected to the blanking deflector 212. The DAC amplifier unit 132 is connected to the sub deflector 209, and the DAC amplifier unit 134 is connected to the main deflector 208.

In the control computer unit 110, there are arranged a writing condition setting unit 50, a shot data generation unit 52, a determination unit 53, a dose calculation unit 54, a setting unit 56, a resist information extraction unit 58, a backscatter dose calculation unit 60, a temperature increase amount calculation unit 62, a width change amount (ΔCD) calculation unit 64, a determination unit 66, a correction coefficient calculation unit 68, a correction unit 70, a determination unit 72, a writing control unit 74, a ΔCD calculation unit 76, and a correlation parameter calculation unit 78. Each " . . . unit" includes a processing circuitry. As the processing circuitry, for example, an electric circuit, computer, processor, circuit board, quantum circuit, or semiconductor device may be used. The processing circuitry included in each " . . . unit" may be a common processing circuitry (same processing circuitry), or different processing circuitries (separate processing circuitries). Input data required in the control computer unit 110, and calculated results are stored in the memory 112 each time.

Writing data is input from the outside of the writing apparatus 100, and stored in the storage device 140. Writing condition information and resist information are input from the outside of the writing apparatus 100, and stored in the storage device 142. Information on a correlation parameter for each resist type is stored in the storage device 144. The information on the correlation parameter for each resist type may be input from the outside of the writing apparatus 100, or calculated inside the writing apparatus 100. Chip A data and chip B data of an evaluation pattern are input from the outside of the writing apparatus 100, and stored in the storage device 146.

FIG. 1 shows configuration elements necessary for describing the first embodiment. It should be understood that other configuration elements generally necessary for the writing apparatus 100 may also be included therein.

Figure 2:
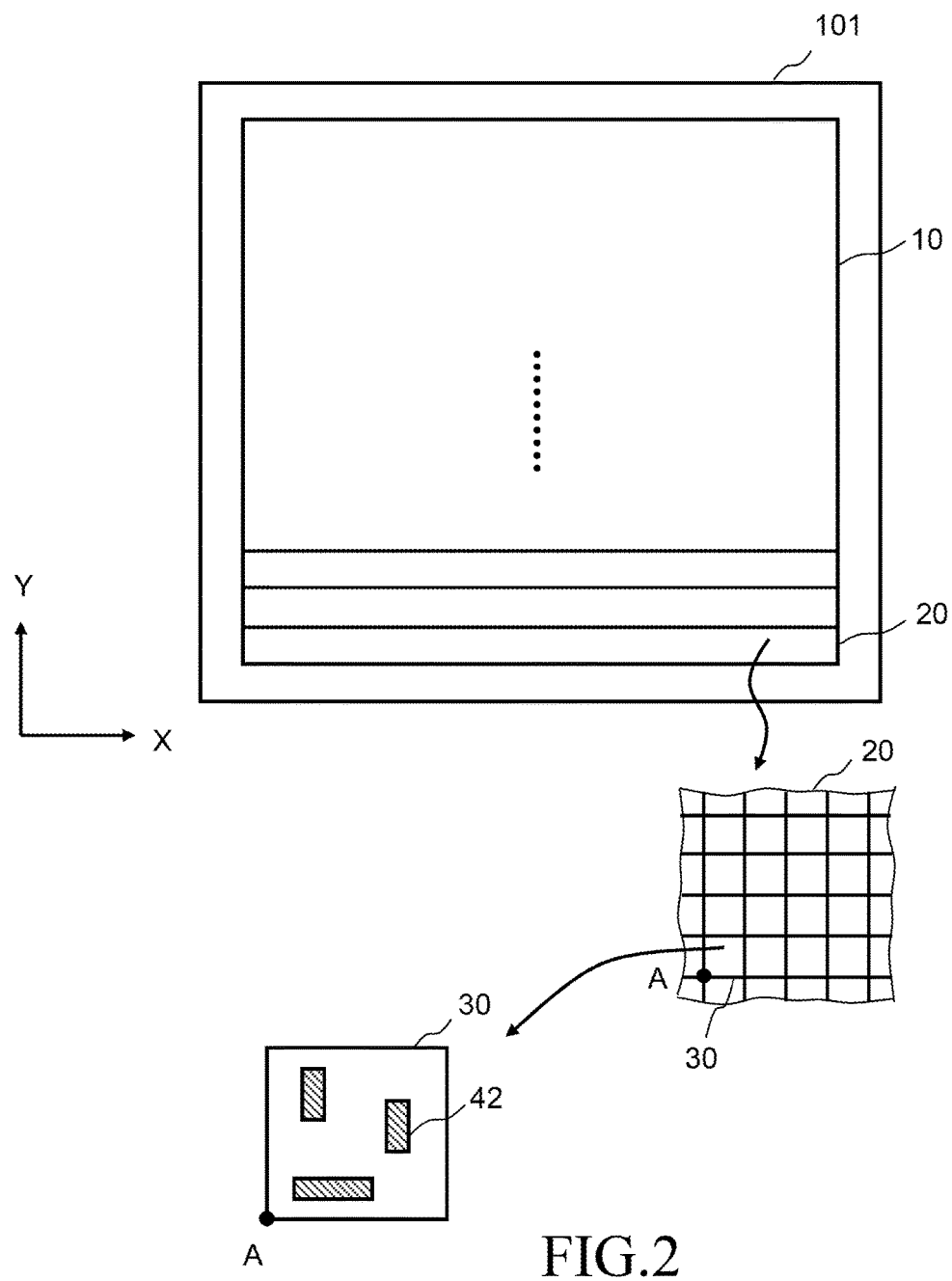
FIG. 2 is a conceptual diagram for explaining each region according to the first embodiment.

FIG. 2 is a conceptual diagram for explaining each region according to the first embodiment. In FIG. 2, a writing region 10 of the target object 101 is virtually divided into a plurality of strip-shaped stripe regions 20 by the width dimension that can be deflected, for example, in the y direction by the main deflector 208. Further, each of the stripe regions 20 is virtually divided into a plurality of mesh-like subfields (SFs) 30 (small regions) by the size that can be deflected by the sub deflector 209. Then, a shot figure is written at each shot position 42 in each SF 30.

A digital signal for blanking control is output from the deflection control circuit 120 to the DAC amplifier unit 130. Then, in the DAC amplifier unit 130, the digital signal is converted to an analog signal, and amplified to be applied as a deflection voltage to the blanking deflector 212. An electron beam 200 is deflected by this deflection voltage so that a beam of each shot may be formed.

A digital signal for controlling main deflection is output from the deflection control circuit 120 to the DAC amplifier unit 134. Then, in the DAC amplifier unit 134, the digital signal is converted to an analog signal and amplified to be applied as a deflection voltage to the main deflector 208. By this deflection voltage, the electron beam 200 is deflected, and thereby each shot beam is deflected to a reference position in a predetermined subfield (SF) obtained by virtually dividing into mesh-like regions.

A digital signal for controlling sub deflection is output from the deflection control circuit 120 to the DAC amplifier unit 132. Then, in the DAC amplifier unit 132, the digital signal is converted to an analog signal and amplified to be applied as a deflection voltage to the sub deflector 209. By this deflection voltage, the electron beam 200 is deflected, and thereby each beam is deflected to each shot position in a predetermined subfield (SF) obtained by virtually dividing into mesh-like regions.

The writing apparatus 100 performs writing processing in each stripe region 20 by using a multiple stage deflector of a plurality of stages. Here, as an example, a two-stage deflector composed of the main deflector 208 and the sub deflector 209 is used. However, it is not limited to the two-state deflector, a single stage deflector or a multiple stage deflector of three or more stages may also be used. While the XY stage 105 is continuously moving in the −x direction, for example, writing is performed in the x direction in the first stripe region 20. After the writing has been finished in the first stripe region 20, continuously writing is performed in the same direction or in the opposite direction in the second stripe region 20. Then, in the same way, writing is performed in the third and subsequent stripe regions 20. The main deflector 208 (first deflector) sequentially deflects the electron beam 200 to a reference position A of the SF 30 such that the movement of the XY stage 105 is followed. The sub deflector 209 (second deflector) deflects the electron beam 200 from the reference position A of each SF 30 to the shot position 42 of an irradiating beam in the SF 30 concerned. Thus, the sizes of the deflection regions of the main deflector 208 and the sub deflector 209 are different from each other. The SF 30 is the smallest deflection region in the deflection regions of the multiple stage deflector.

In the case where a shot position of interest (shot position concerned, target shot position) exists in the range of influence of the proximity effect of a peripheral shot, the shot position of interest is exposed by a backscattered electron generated by the beam irradiation of the peripheral shot, at substantially the same time with the beam irradiation of the peripheral shot. Therefore, in the conventional proximity effect correction, calculation is performed considering that the dose of the backscattered electron is accumulated at the shot position of interest. Then, it is supposed that temperature affects not only when a shot of interest (target shot) is performed to the shot position of interest (shot position concerned) but also when the shot position of interest is exposed by the backscattered electron generated by other shots. However, in the conventional proximity effect correction, the influence of temperature at the time of the shot position of interest being exposed by the backscattered electron has not been considered. Therefore, when the heating effect of backscatter is large, the correction error is large in the conventional calculation model. Then, it is desirable to grasp (measure) the amount of dimensional change due to the heating effect accompanied by exposure of a backscattered electron while separating it from the amount of dimensional change due to other causes.

Figure 3A:
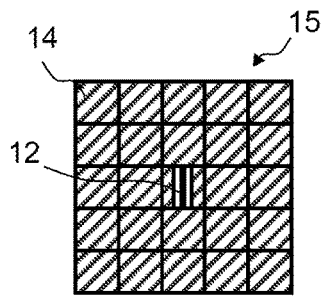
FIGS. 3A to 3C show examples of a backscattering amount and a temperature increase amount at a width dimension measurement position in a comparative example (1) to the first embodiment.
Figure 3B:
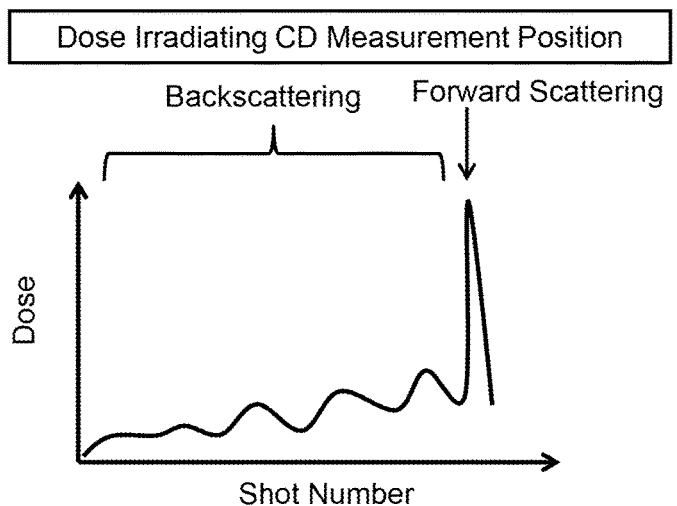
Figure 3C:
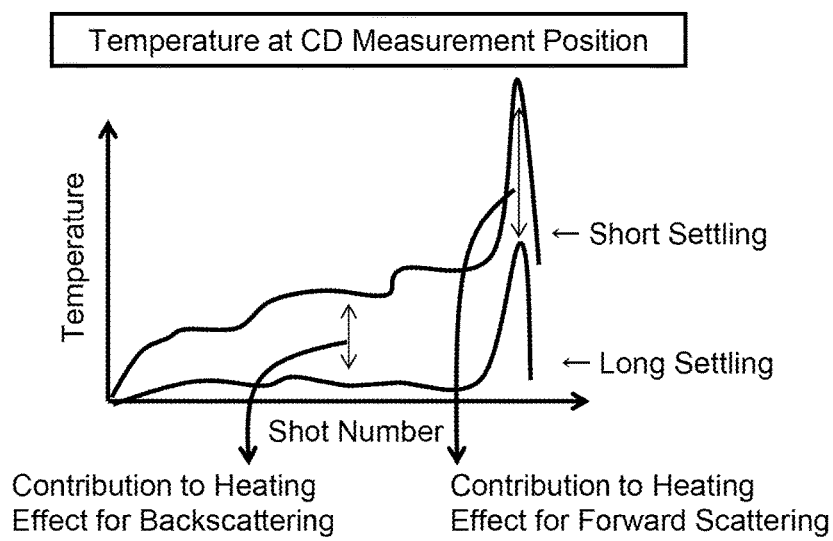

FIGS. 3A to 3C show examples of a backscattering amount and a temperature increase amount at a width dimension measurement position in a comparative example (1) to the first embodiment. The example of FIG. 3A shows the case of writing a line-shaped evaluation pattern 12 at the position (width dimension measurement position) where a width dimension (CD) is measured, after writing a peripheral pattern 14 on the periphery of the position where the CD is measured, on the evaluation substrate coated with resist, by using a plurality of shots of electron beams. The example of FIG. 3A also shows the case where the evaluation pattern 12 is formed by connecting a plurality of quadrangular shot figures in a line to be a line pattern. On the other hand, the peripheral pattern 14 is a so-called solid pattern that fills the peripheral region. The peripheral pattern 14 and the evaluation pattern 12 are defined in one chip data, and each shot is performed continuously with having a waiting time between shots being a set stabilization time (settling time). Here, the case of setting the waiting time between shots to be a short settling time (short settling), and the case of setting the waiting time between shots to be a long settling time (long settling) are evaluated. In addition, for example, a central shot figure of quadrangular shot figures forming the evaluation pattern 12 is set as a CD measurement position.

In that case, in FIG. 3B, the ordinate axis represents a dose irradiating (exposing) the CD measurement position, and the abscissa axis represents shot numbers in the order of shot in writing a plurality of shot figures forming the evaluation pattern 12 and the peripheral pattern 14. Since the writing starts from the peripheral pattern 14, FIG. 3B shows the dose of an electron irradiating the CD measurement position in the backscattered electrons generated by the shot for the peripheral pattern 14 at each beam shot time in writing a plurality of shot figures forming the peripheral pattern 14. Then, FIG. 3B shows the dose of a beam itself (forward scattering) of a shot in finally writing a plurality of shot figures forming the evaluation pattern 12. Since the dose of a beam itself (forward scattering) of each shot for the peripheral pattern 14 does not change even if the settling time between shots differs, as shown in FIG. 3B, the dose (backscatter dose) of a backscattered electron is the same value regardless of the settling time between shots.

On the other hand, the situation of the temperature at the CD measurement position is different from what is described above. The temperature at the CD measurement position of the evaluation substrate changes due to transferred heat of the temperature increased by a beam previously shot at another position. As shown in FIG. 3C, in the case of the settling time being short, the temperature at the CD measurement position of the evaluation substrate continues to increase because, before the temperature having been increased due to heat transferred from a previous shot has fallen by heat release (diffusion), other heat is transferred from a next shot. On the other hand, in the case of the settling time being long, the increase of the temperature at the CD measurement position of the evaluation substrate can be suppressed because, after the temperature having been increased due to heat transferred from a previous shot has fallen by heat release (diffusion), other heat is transferred from a next shot. Therefore, the resist temperature at the time of finally writing a plurality of shot figures forming the evaluation pattern 12 is different between the cases of the short settling time and the long settling time. Accordingly, resist resolution by the dose of a shot at the time of writing a plurality of shot figures forming the evaluation pattern 12 is larger in the case of the short settling time and therefore the high resist temperature. Therefore, even if the width dimension (CD) measured at a CD measurement position of the finally obtained evaluation pattern 12 in the case of the short settling time is compared with that in the case of the long settling time, it is difficult to separate the amount of dimensional change due to a heating effect accompanied by exposure of a backscattered electron from the amount of dimensional change due to other causes.

Figure 4A:
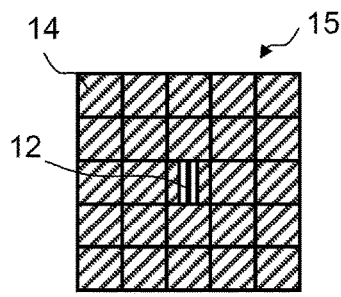
FIGS. 4A to 4D show examples of a backscattering amount and a temperature increase amount at a width dimension measurement position in a comparative example (2) to the first embodiment.

FIGS. 4A to 4D show examples of a backscattering amount and a temperature increase amount at a width dimension measurement position in a comparative example (2) to the first embodiment. The example of FIG. 4A shows the case of writing the peripheral pattern 14 on the periphery of the position (width dimension measurement position)

where the width dimension (CD) is measured, on the evaluation substrate coated with resist, by using a plurality of shots of electron beams, after writing the line-shaped evaluation pattern 12 at the position where the CD is measured. The writing order of FIG. 4A is an example of a reverse writing order to that of FIG. 3A. Also in FIG. 4A, the peripheral pattern 14 and the evaluation pattern 12 are defined in one chip data, and each shot is performed continuously with having awaiting time between shots being a set stabilization time (settling time). In the example of FIG. 4A, similarly to FIG. 3A, the case of setting the waiting time between shots to be a short settling time (short settling), and the case of setting the waiting time between shots to be a long settling time (long settling) are evaluated. In addition, for example, a central shot figure of quadrangular shot figures forming the evaluation pattern 12 is set as a CD measurement position.

Figure 4B:
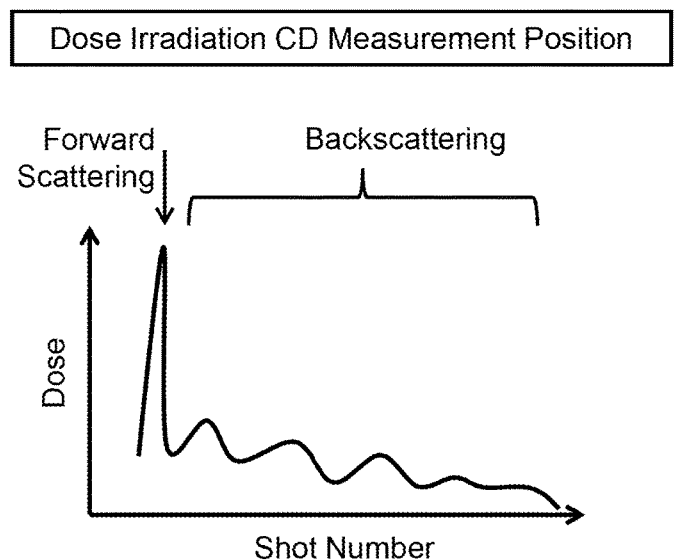

In that case, in FIG. 4B, the ordinate axis represents a dose irradiating (exposing) the CD measurement position, and the abscissa axis represents shot numbers in the order of shot in writing a plurality of shot figures forming the evaluation pattern 12 and the peripheral pattern 14. FIG. 4B shows the dose of a beam itself (forward scattering) of a shot in firstly writing a plurality of shot figures forming the evaluation pattern 12. Then, subsequently, FIG. 4B shows the dose of an electron irradiating the CD measurement position in the backscattered electrons generated by the shot for the peripheral pattern 14 at each beam shot time in writing a plurality of shot figures forming the peripheral pattern 14. Since the dose of a beam itself (forward scattering) of each shot for the peripheral pattern 14 does not change even if the settling time between shots differs, as shown in FIG. 4B, the dose (backscatter dose) of a backscattered electron is the same value regardless of the settling time between shots.

Figure 4C:
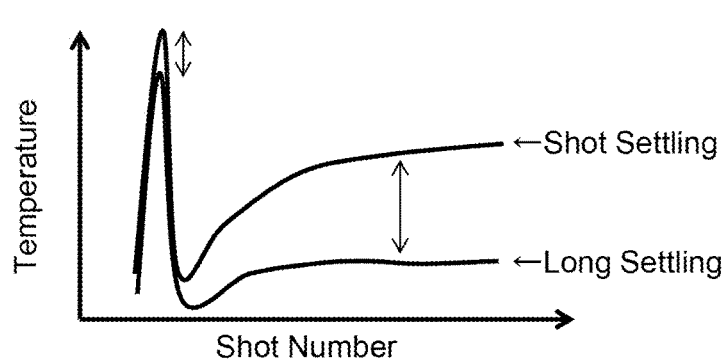

On the other hand, the situation of the temperature at the CD measurement position is different from what is described above. Since the peripheral pattern 14 is subsequently written as shown in FIG. 4C, when compared with FIG. 3C, there is no resist temperature increase at the time of writing a plurality of shot figures forming the evaluation pattern 12 due to heat transferred from each shot for the peripheral pattern 14. However, in the case of the short settling time, since the writing of the peripheral pattern 14 is started before the resist temperature having been increased due to a plurality of shots for forming the evaluation pattern 12 has fallen by heat release (diffusion), the resist temperature at the time of backscattered electrons, generated by each shot for the peripheral pattern 14, exposing the CD measurement position is different between the cases of the short settling time and the long settling time. Accordingly, resist resolution by the dose of a backscattered electron at the CD measurement position at writing start of the peripheral pattern 14 is larger in the case of the short settling time and therefore the high resist temperature.

Figure 4D:
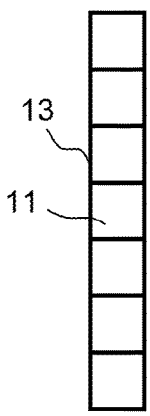

Furthermore, as shown in FIG. 4D, in the case of the short settling time, the resist temperature at the time of a shot 11 has increased due to heat transferred from a shot 13 of a beam irradiation applied before the shot 11 at the CD measurement position when forming the evaluation pattern 12. Therefore, the resist temperature at the time of writing a plurality of shot figures forming the evaluation pattern 12 is different between the cases of the short settling time and the long settling time. Accordingly, resist resolution by the dose of a shot in writing a shot figure forming the evaluation pattern 12 at the CD measurement position is larger in the case of the short settling time and therefore the high resist temperature.

Therefore, even if the width dimension (CD) measured at a CD measurement position of the finally obtained evaluation pattern 12 in the case of the short settling time is compared with that in the case of the long settling time, the amount of dimensional change due to a heating effect accompanied by exposure of a backscattered electron is not separated from the amount of dimensional change due to other causes.

Then, according to the first embodiment, the amount of dimensional change due to a heating effect accompanied by exposure of a backscattered electron is separated from the amount of dimensional change due to other causes by performing measurement as described below.

Figure 5:
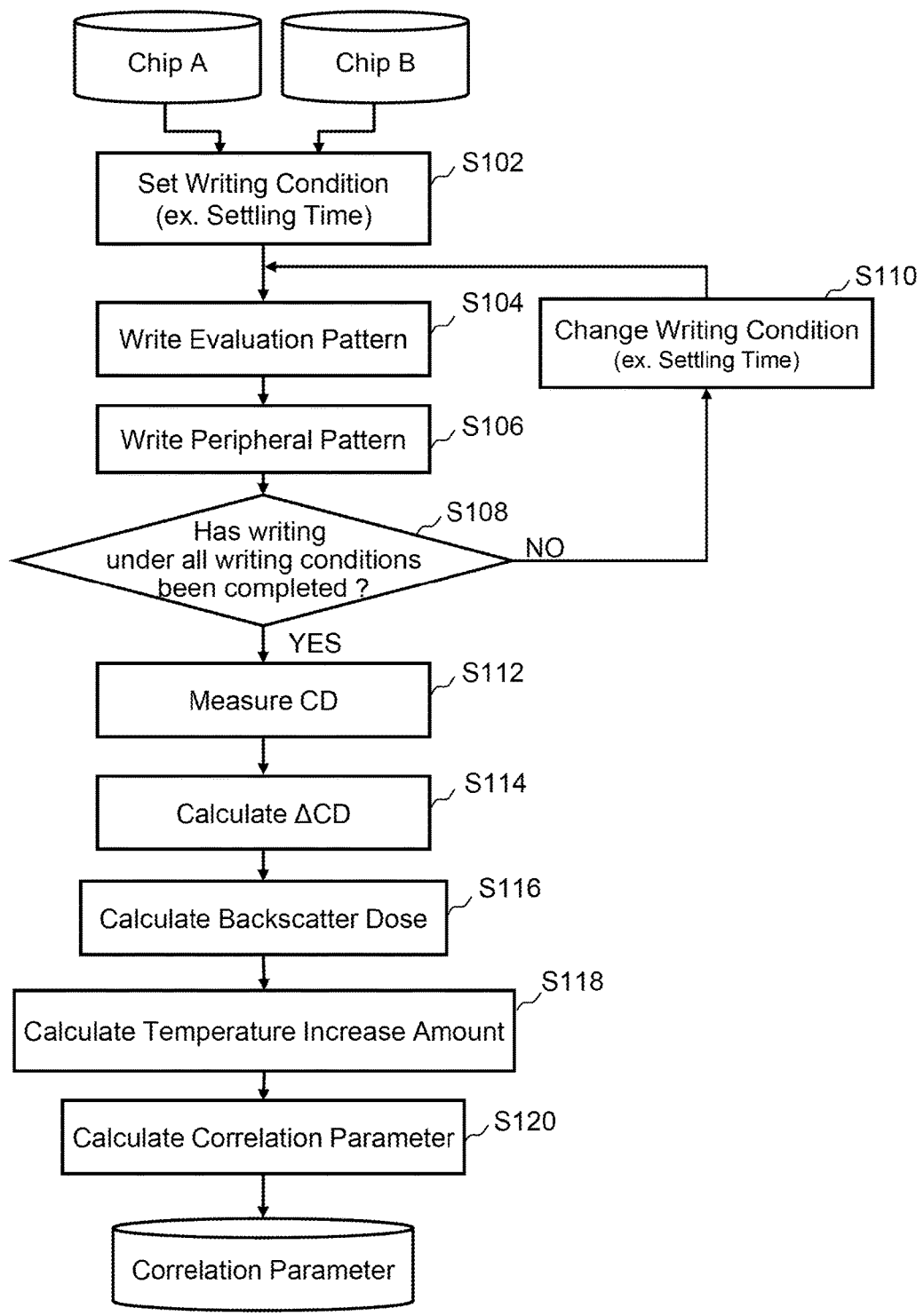
FIG. 5 is a flowchart showing main steps of a method for acquiring a parameter for correcting the dose of an electron beam according to the first embodiment.

FIG. 5 is a flowchart showing main steps of a method for acquiring a parameter for correcting the dose of an electron beam according to the first embodiment. As shown in FIG. 5, the method for acquiring a parameter for correcting the dose of an electron beam according to the first embodiment executes a series of steps: a writing condition setting step (S102), an evaluation pattern writing step (S104), a peripheral pattern writing step (S106), a determination step (S108), a writing condition change step (S110), a width dimension (CD) measurement step (S112), a width change amount ($\Delta$CD) calculation step (S114), a backscatter dose calculation step (S116), a temperature increase amount calculation step (S118), and a correlation parameter calculation step (S120).

In the writing condition setting step (S102) the writing condition setting unit 50 sets writing conditions for writing the chip A and the chip B to the writing apparatus 100 (writing control unit 74, for example). As an example of the writing conditions, settling time between a plurality of shots can be cited. A long settling time is set in the chip A. For example, the time is set to be 800 ns. In the chip A, the settling time being a waiting time between shots should be set such that a shot of interest starts after the temperature having been increased due to heat transferred from a peripheral shot has diffused. Next, the settling time between a plurality of shots for forming a pattern of the chip B is set. In the chip B, a plurality of settling times from a short settling time to a long settling time are determined in advance. For example, 20 ns, 50 ns, 100 ns, 300 ns, and 800 ns are determined in advance. Then, one of a plurality of settling times is set. For example, 20 ns is set. As will be described later, in the chip B, a pattern of the chip B is written a plurality of times while varying the settling time per pattern of the chip B. The writing condition setting unit 50 sets other writing conditions. For example, a dose, the number of passes (multiplicity) of multiple writing, the order of writing of shots, the maximum shot size, etc. can be cited.

Figure 6A:
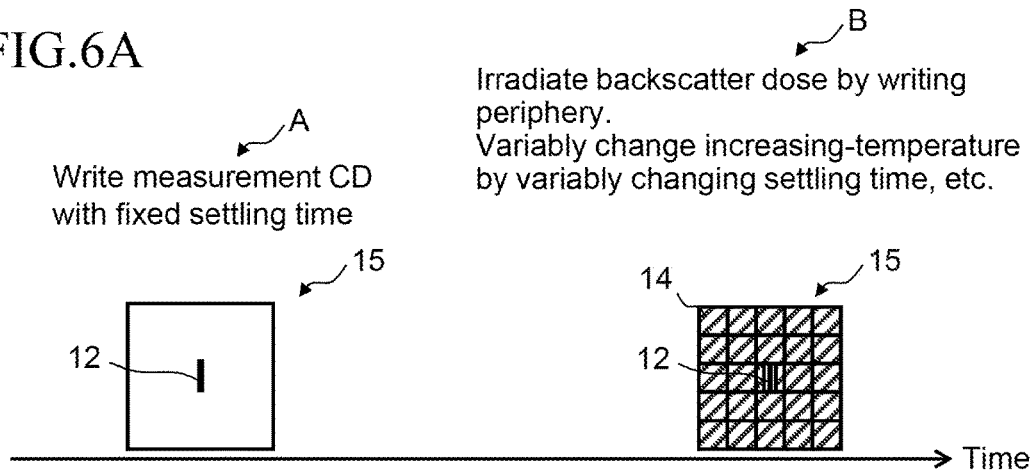
FIGS. 6A and 6B show an example of an evaluation method and a temperature increase amount at a width dimension measurement position according to the first embodiment.
Figure 6B:
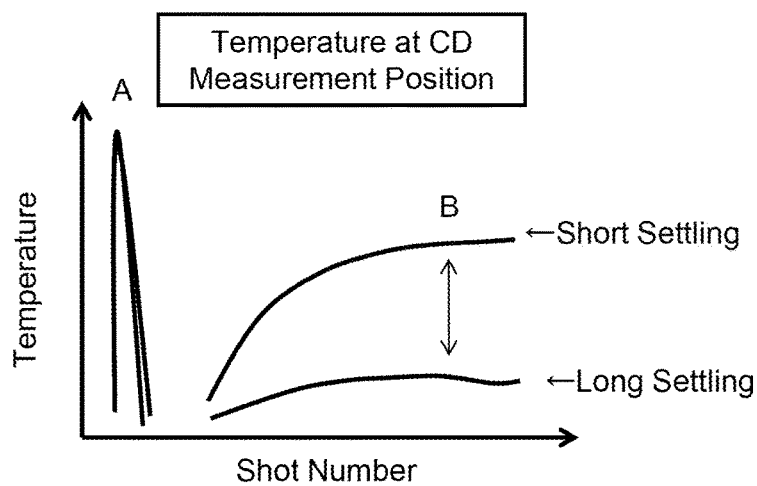

FIGS. 6A and 6B show an example of an evaluation method and a temperature increase amount at a width dimension measurement position according to the first embodiment. As shown in FIG. 6A, according to the first embodiment, the evaluation pattern 12 and the peripheral pattern 14 are defined in different chips. In the example of FIG. 6A, the evaluation pattern 12 is defined in the chip A, and the peripheral pattern 14 is defined in the chip B. In the example of FIG. 6A, one evaluation pattern 12 being a line pattern is arranged in one SF 30, for example. Then, while centering the SF 30, the peripheral pattern 14 composed of what is called solid patterns for writing the whole area is arranged in each of a plurality of SFs 30 in an influence range 15 of the proximity effect 15. Also, with respect to the SF 30 in which the evaluation pattern 12 is arranged, it is preferable that solid patterns are arranged in a remaining region while having a space to the evaluation pattern 12. The space can be any size as long as the width dimension of the evaluation pattern 12 can be measured by a dimension measuring instrument. For example, the space may be several times the maximum shot size, such as around five times. As shown in FIG. 6A, first, writing of the chip A in which the evaluation pattern 12 is defined is performed. Then, changing the writing target chip to the chip B from the chip A, the chip B in which the peripheral pattern 14 is defined is written on the periphery of the evaluation pattern 12. While varying the writing conditions (the settling time in this case) of the chip B, combining the writing of the chip A and the writing of the chip B is performed a plurality of times. Specifically, it is described below.

In the evaluation pattern writing step (S104), the writing unit 150 controlled by the writing control unit 74 writes, using the electron beam 200, a plurality of evaluation patterns 12 defined in the chip A, on the evaluation substrate 300 coated with resist. Here, the evaluation pattern 12 is written at each separated position on the evaluation substrate 300. For example, the evaluation pattern 12 is written in every several stripe regions 20. The distance between the adjacent two evaluation patterns 12 is preferably the distance by which the resist temperature at the position where the evaluation pattern 12 of interest is written does not increase by the heat transferred from the beam shot for writing the other evaluation pattern 12 of the two, and the evaluation pattern 12 of interest is located out of the influence range of the proximity effect of the beam shot for writing the other evaluation pattern 12. That is, when writing the evaluation pattern 12 of interest, it is necessary to keep the distance by which no influence of writing of the other evaluation pattern 12 of the two is given. Here, although there has been described the case of defining a plurality of evaluation patterns 12 in the chip A, and writing a plurality of evaluation patterns 12 in one evaluation substrate 300 while changing the writing position, it is not limited thereto. It is also preferable to write the evaluation pattern 12 on each of different evaluation substrates 300.

In order to write a plurality of evaluation patterns 12 defined in the chip A, the shot data generation unit 52 reads chip data of the chip A from the storage device 146, performs multiple stages of data conversion processing, and divides the evaluation pattern 12 defined in the chip A into a plurality of shot figures which can be written by the writing apparatus 100. Then, shot data defining a figure type, a coordinate position, size, etc. for each shot figure is generated. The generated shot data is stored in the storage device 148. The shot data is output, under the control of the writing control unit 74, to the deflection control circuit 120, various deflection data is generated, and writing is performed by the writing unit 150 controlled by the writing control unit 74.

In the peripheral pattern writing step (S106), the writing unit 150 controlled by the writing control unit 74 writes, using a plurality of shots of the electron beam 200, the peripheral pattern 14 defined in the chip B according to corresponding writing conditions, on the periphery of any different one of a plurality of evaluation patterns 12 after the time that can be disregarded with respect to the influence of resist temperature increase due to writing of the evaluation pattern 12 concerned has passed. Here, for example, the peripheral pattern 14 is written with waiting time between shots whose settling time is set to be 20 ns on the periphery of one of a plurality of evaluation patterns 12.

In the determination step (S108), the determination unit 53 determines whether the peripheral pattern writing step (S106) under all the scheduled predetermined writing conditions has been completed. Here, for example, it is determined whether the peripheral pattern writing step (S106) has been completed with respect to all of a plurality of settling times prepared for writing the peripheral pattern 14. When the peripheral pattern writing step (S106) under all the scheduled predetermined writing conditions has been completed, it proceeds to the width dimension (CD) measurement step (S112). When the peripheral pattern writing step (S106) under all the scheduled predetermined writing conditions has not been completed yet, it proceeds to the writing condition change step (S110).

In the writing condition change step (S110), the writing condition setting unit 50 changes the writing conditions for writing the chip B having been set in the writing apparatus 100. For example, the settling time is changed to 50 ns from 20 ns. Then, returning to the peripheral pattern writing step (S106), steps from the peripheral pattern writing step (S106) to the writing condition change step (S110) are repeated until it is determined that the peripheral pattern writing step (S106) under all the scheduled predetermined writing conditions has been completed. In that case, under each writing condition, the evaluation pattern 12 around which the peripheral pattern 14 is written on the periphery is changed to another evaluation pattern 12.

As described above, according to the first embodiment, while varying the writing conditions for each evaluation pattern 12, under each writing condition, the peripheral pattern 14 defined in the chip B according to corresponding writing conditions is written on the periphery of any different one of a plurality of evaluation patterns 12 by using a plurality of shots of the electron beam 200, after the time that can be disregarded with respect to the influence of resist temperature increase due to writing of the evaluation pattern 12 concerned has passed.

In order to write the peripheral pattern 14 defined in the chip B, the shot data generation unit 52 reads chip data of the chip B from the storage device 146, performs multiple stages of data conversion processing, and divides the peripheral pattern 14 defined in the chip B into a plurality of shot figures which can be written by the writing apparatus 100. Then, shot data defining a figure type, a coordinate position, size, etc. for each shot figure is generated. The generated shot data is stored in the storage device 148. The shot data is output, under the control of the writing control unit 74, to the deflection control circuit 120, various deflection data is generated, and writing is performed by the writing unit 150 controlled by the writing control unit 74. Due to the time of such data processing, by the time of starting to write the peripheral pattern 14, the time that can be disregarded with respect to the influence of resist temperature increase due to writing of the evaluation pattern 12 concerned has passed. According to the first embodiment, by dividing into the chip A and the chip B, the influence of the resist temperature increase due to writing the evaluation pattern 12 can be eliminated when the backscattered electron resulting from writing of the peripheral pattern 14 exposes the dimension measurement position of the evaluation pattern 12.

As shown in FIG. 6B, since the chip is changed and then the peripheral pattern 14 is written, that is, since writing of the peripheral pattern 14 is started after the resist temperature having been increased due to a plurality of shots for forming the evaluation pattern 12 has fallen by heat release (diffusion), it becomes possible not to affect the resist temperature at a CD measurement position exposed by backscattered electrons generated by each shot for the peripheral pattern 14.

Therefore, the resist temperature of a CD measurement position at the time of backscattered electrons exposing the CD measurement position can be compared between the cases of the short settling time and the long settling time in the state in which other factors are eliminated. The dose of a beam itself (forward scattering) of a shot in writing a plurality of shot figures forming the evaluation pattern 12, and the dose irradiating a CD measurement position in backscattered electrons, generated by the shot for the peripheral pattern 14, at the time of each beam shot in writing a plurality of shot figures forming the peripheral pattern 14 are the same as those in FIG. 4B. In other words, the dose of backscattered electrons does not depend on the waiting time (settling time) between shots. Therefore, it is the same as that in FIG. 4B.

Furthermore, according to the first embodiment, since the evaluation pattern 12 is formed by being written with each shot whose settling time is long, even if the resist temperature at the CD measurement position increases due to heat transferred from the shot 13 of a beam irradiation applied before the shot 11 at the CD measurement position shown in FIG. 4D, the shot 11 to the CD measurement position can be performed after the resist temperature has fallen by heat release (diffusion). Therefore, when the width dimension CD measured at the CD measurement position of the evaluation pattern 12 finally obtained is compared between the cases of the short settling time and the long settling time, the dimension difference can be measured as a dimension change amount resulting from a heating effect accompanied by exposure of a backscattered electron, while separating it from the amount of dimensional change due to other causes.

The evaluation substrate 300, on which several combinations of the evaluation pattern 12 and the peripheral pattern 14 whose writing conditions are different from each other are written, is taken out from the writing apparatus 100 to be developed. Thereby, a resist pattern of a plurality of combinations of the evaluation pattern 12 and the peripheral pattern 14 whose writing conditions are different from each other is formed. Using this resist pattern as a mask, a light shielding film is etched, and then, the resist material is removed by ashing etc., so that a pattern group of several combinations of the evaluation pattern 12 and the peripheral pattern 14 whose writing conditions are different from each other is formed by a light shielding film.

In the width dimension (CD) measurement step (S112), the width dimension CD of the evaluation pattern 12 around which the peripheral patterns 14 are written is measured using a dimension measuring instrument (not shown), under each writing condition.

In the width change amount ($\Delta$CD) calculation step (S114), the $\Delta$CD calculation unit 76 calculates a width change amount ($\Delta$CD) of the evaluation pattern 12, under each writing condition.

Figure 7A:
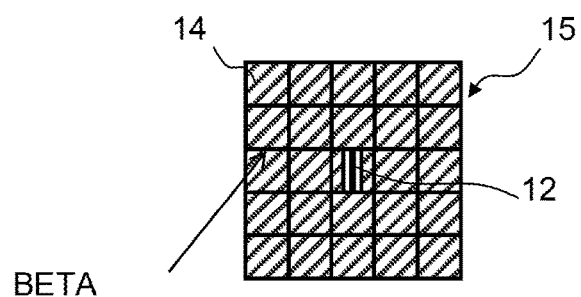
FIGS. 7A and 7B show an example of a relation between a width dimension of an evaluation pattern and a settling time according to the comparative example (2) to the first embodiment.
Figure 7B:
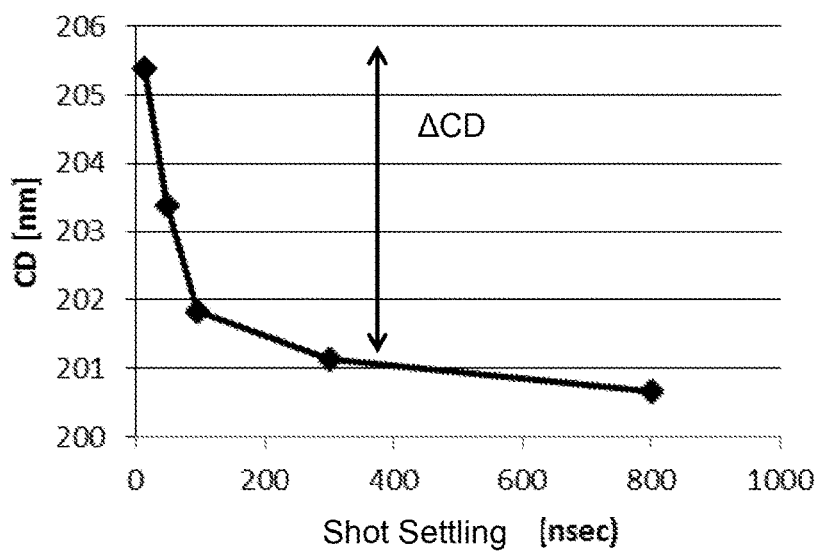

FIGS. 7A and 7B show an example of a relation between a width dimension of an evaluation pattern and a settling time according to the comparative example (2) to the first embodiment. FIG. 7A is the same as FIG. 4A. That is, in the example of FIG. 7A, the evaluation pattern 12 and the peripheral pattern 14 are defined in the same chip, and the peripheral pattern 14 is written on the periphery of the position (width dimension measurement position) where the width dimension (CD) is measured, on the evaluation substrate coated with resist, by using a plurality of shots of electron beams, after writing the line-shaped evaluation pattern 12 at the position where the CD is measured, and continuously after the set settling time has passed. Such writing is similarly performed while changing the settling time. Consequently, as shown in FIG. 7B, the width dimension CD at the width dimension measurement position finally acquired changes for each settling time. The width dimension CD written with the settling time of, for example, 300 ns or more within which the width dimension CD converges can be regarded as a value in the case of there being no dimension change amount due to a heating effect. The width dimension CD in the case of there being no dimension change amount due to a heating effect becomes larger as the settling time becomes shorter. The difference of the width dimension CD between the case of no dimension change and the case of CD becoming larger is a width dimension change amount ($\Delta$CD) for each settling time. However, as described above, in the method of the comparative example (2), what changes is not only the amount of dimensional change due to a heating effect accompanied by exposure of backscattered electrons. Therefore, it is difficult to calculate, from the result described above, the amount of dimensional change due to a heating effect accompanied by exposure of a backscattered electron.

Figure 8A:
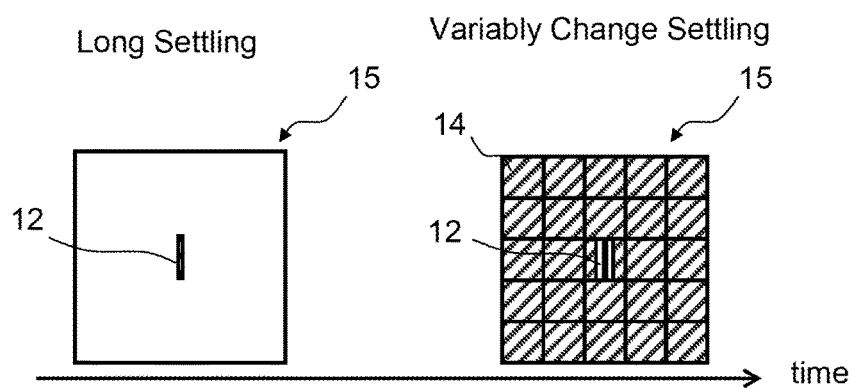
FIGS. 8A and 8B show an example of a relation between a width dimension of an evaluation pattern and a settling time according to the first embodiment.
Figure 8B:
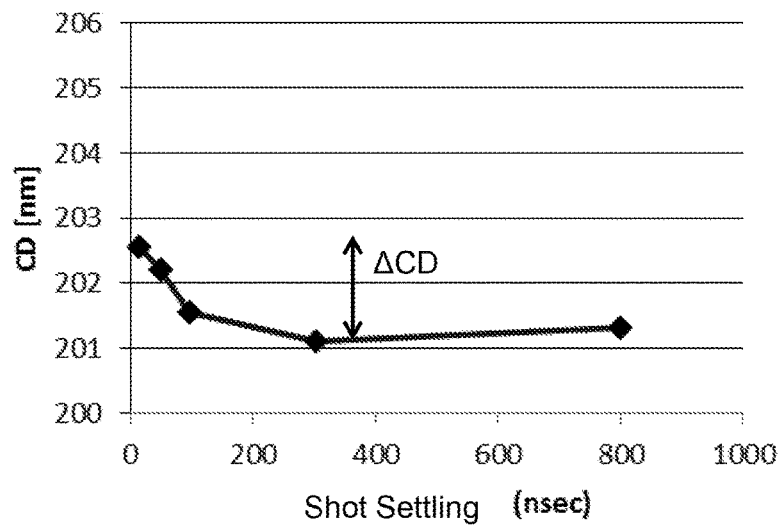

FIGS. 8A and 8B show an example of a relation between a width dimension of an evaluation pattern and a settling time according to the first embodiment. FIG. 8A is the same as FIG. 6A. That is, the evaluation pattern 12 and the peripheral pattern 14 are individually defined in different chips, and the peripheral pattern 14 defined in chip B is written on the periphery of the position (width dimension measurement position) where the width dimension (CD) is measured, on the evaluation substrate 300 coated with resist, by using a plurality of shots of electron beams, after the line-shaped evaluation pattern 12 defined in chip A is written at the position where the CD is measured. Such writing is similarly performed while changing the settling time. Consequently, as shown in FIG. 8B, the width dimension CD at the width dimension measurement position finally acquired changes for each settling time. The width dimension CD written with the settling time of, for example, 300 ns or more within which the width dimension CD converges can be regarded as a value in the case of there being no dimension change amount due to a heating effect. The width dimension CD in the case of there being no dimension change amount due to a heating effect becomes larger as the settling time becomes shorter. The difference of the width dimension CD between the case of no dimension change and the case of CD becoming larger is a width dimension change amount ($\Delta$CD) for each settling time. As understood from that $\Delta$CD of FIG. 8B is smaller than $\Delta$CD of FIG. 7B, the $\Delta$CD of FIG. 8B is shown such that change of the amount of dimensional change due to a heating effect accompanied by exposure of a backscattered electron is separated from the amount of dimensional change due to other causes. Therefore, based on such result, it is possible to calculate the amount of dimensional change due to a heating effect accompanied by exposure of a backscattered electron.

In the backscatter dose calculation step (S116), the backscatter dose calculation unit 60 calculates, under each writing condition, a backscatter dose which reaches to the evaluation pattern 12 concerned from each of a plurality of shots for forming the peripheral pattern 14.

Figure 9A:
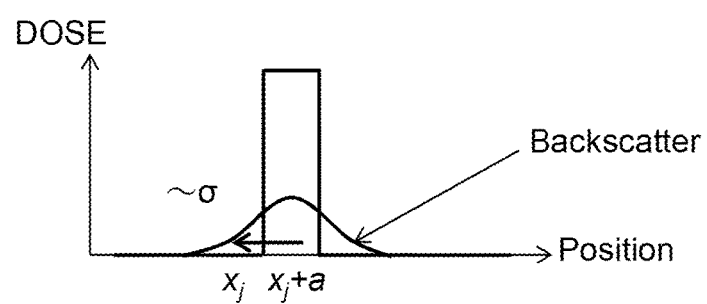
FIGS. 9A and 9B show an example of a calculation model for calculating a backscatter dose which reaches to the shot position of interest according to the first embodiment.
Figure 9B:
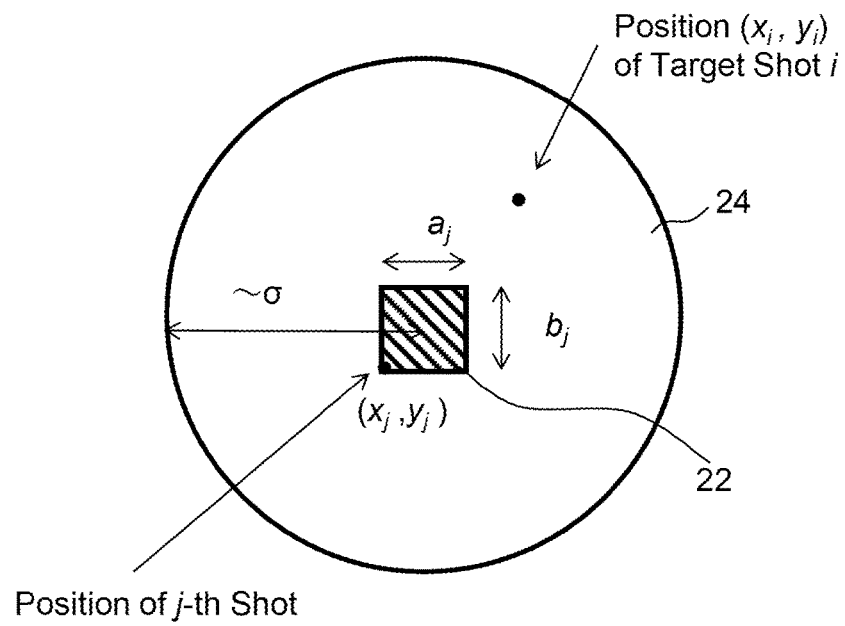

FIGS. 9A and 9B show an example of a calculation model for calculating a backscatter dose which reaches to the shot position of interest (shot position concerned) according to the first embodiment. The example of FIG. 9A shows an incident dose (forward scattered electron) and a backscattered electron in the case where an electron beam is applied to a peripheral shot position j being different from the position (xi, yi) of a target shot position i. The dose of a forward scattered electron is shown by a quadrangle. The dose of a backscattered electron is shown by the profile of a distribution function. The example of FIG. 9B shows an example of a positional relation between the position (xj, yj) of the peripheral shot position j and the position (xi, yi) of the target shot position i. The example of FIG. 9B shows the case where, when the peripheral shot position j is irradiated with the shot j of beam size (aj×bj), the coordinates (xi, yi) of the target shot position i exist in the backscatter radius σ (influence radius of proximity effect) centering on the peripheral shot position j. In that case, the backscatter dose dj by the j-th shot, which reaches to the target shot position i, can be defined by the equation (1) described below, using the position (xi, yi) of the i-th shot, the position (xj, yj) of the j-th shot, the beam dose Dj of the j-th shot, the backscatter rate η, the backscatter radius σ, and the beam size (aj×bj) of the j-th shot.

[Equation 1]

$$d_j = \frac{D_j \cdot \eta}{4} \left\{ \mathrm{erf}\left(\frac{x_i - x_j}{\sigma}\right) - \mathrm{erf}\left(\frac{x_i - x_j - a_j}{\sigma}\right) \right\} \tag{1}$$
$$\left\{ \mathrm{erf}\left(\frac{y_i - y_j}{\sigma}\right) - \mathrm{erf}\left(\frac{y_i - y_j - b_j}{\sigma}\right) \right\}$$

In the temperature increase amount calculation step (S118), the temperature increase amount calculation unit 62 calculates, under each writing condition, a temperature increase amount of the evaluation pattern 12 concerned, which is increased due to heat transferred from a shot previous to the shot concerned, at each shot time of a plurality of shots for forming the peripheral pattern 14.

Figure 10:
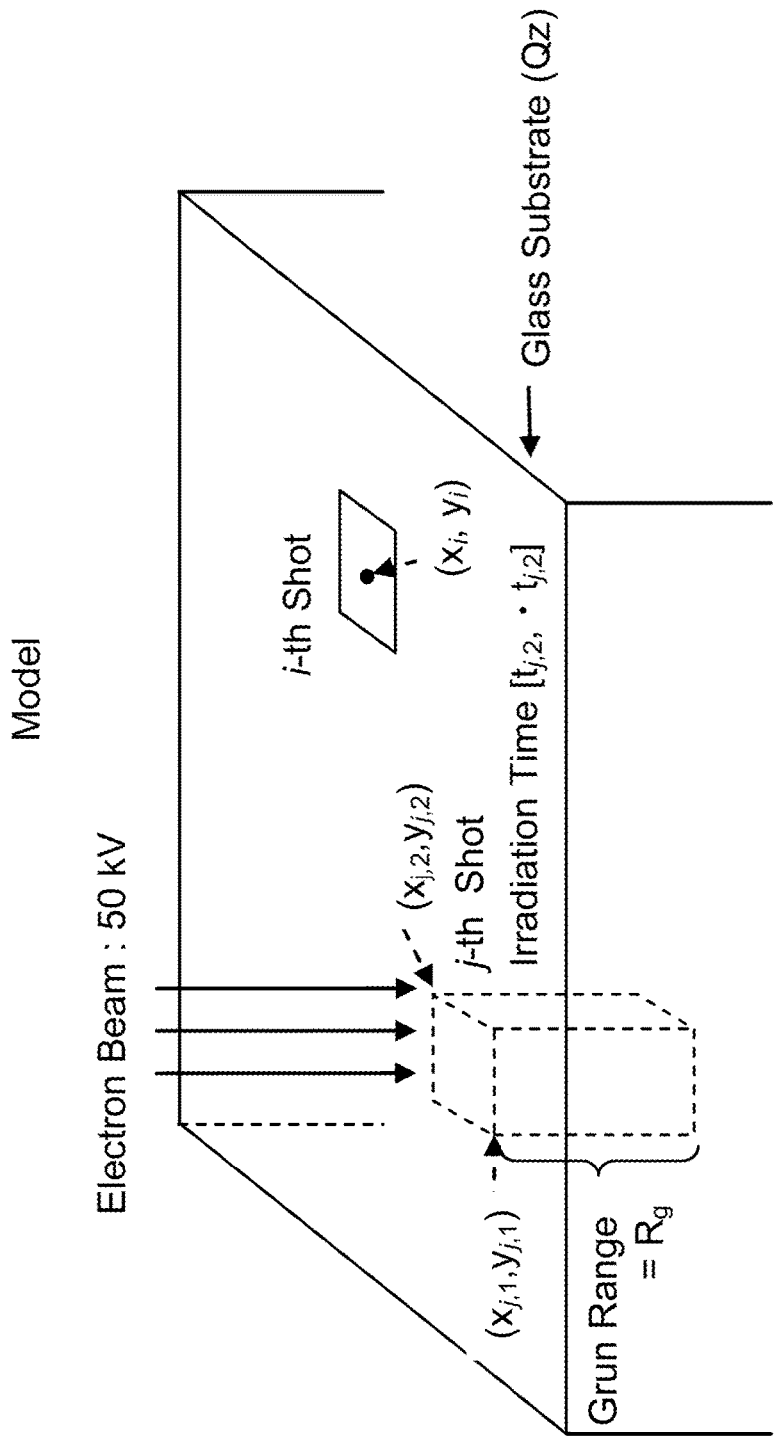
FIG. 10 shows an example of a calculation model for calculating a temperature increase amount at a shot position of interest, which is increased due to heat transferred from another shot, according to the first embodiment.

FIG. 10 shows an example of a calculation model for calculating a temperature increase amount at a shot position of interest (target shot position), which is increased due to heat transferred from another shot, according to the first embodiment. In FIG. 10, it is supposed that heat is transferred from the j-th shot to the position (xi, yi) of the i-th target shot. Moreover, it is supposed that all the energies of shots of electron beams are distributed in a rectangular parallelepiped of shot size. The depth direction size of the rectangular parallelepiped shall be the range, called "Grun range" (Rg), (when acceleration voltage is 50 kV, for example, it is 20 μm or less) in the glass substrate (quartz) of an electron acquired from an experimental formula. The medium of heat transfer is a glass substrate only, and the light-shielding film and the resist are not take into consideration. In that case, a temperature increase amount δTij at the time t at the i-th shot position of interest, which is generated due to heat transfer from the j-th shot, can be defined by the equation (2) described below, using Grun range Rg, density ρ of a glass substrate, specific heat Cp of a glass substrate, acceleration voltage V, current density J, beam irradiation start time $t_{j,1}$ of the j-th shot, beam irradiation finish time $t_{j,2}$ of the j-th shot, coefficient k, beam irradiation time ti of the i-th shot of interest, time t concerned, position (xi, yi) of the i-th shot of interest, position $(x_{j,1}, y_{j,1})$ at lower left corner of the j-th shot, and position $(x_{j,2}, y_{j,2})$ at upper right corner of the j-th shot.

[Equation 2]

$$\delta T_{ij} = \frac{V \cdot J}{R_g \cdot \rho \cdot C_p} \int_{t_{j,1}}^{t_{j,2}} \mathrm{erf}\left(\frac{R_g}{\sigma'}\right) \cdot F dt \tag{2}$$

However, the function F in the equation (2) is defined by the following equation (3).

[Equation 3]

$$F = \tag{3}$$
$$\frac{1}{2}\left\{ \mathrm{erf}\left(\frac{x_i - x_{j,1}}{\sigma'}\right) - \mathrm{erf}\left(\frac{x_i - x_{j,2}}{\sigma'}\right) \right\} \cdot \frac{1}{2}\left\{ \mathrm{erf}\left(\frac{y_i - y_{j,1}}{\sigma'}\right) - \mathrm{erf}\left(\frac{y_i - y_{j,2}}{\sigma'}\right) \right\}$$

However, the function σ' in the equations (2) and (3) is defined by the following equation (4).

[Equation 4]

$$\sigma' = 2\sqrt{k(t_i - t)} \tag{4}$$

Thus, a temperature increase amount Ti(t) at the shot position of the i-th shot of interest and at the time t concerned, which has been increased because of heat transferred from all the shots previous to the time t concerned, is a sum of temperature increase amounts δTij at the i-th shot position of interest and at the time t, which are generated due to heat transferred from each shot performed before the time t, can be defined by the following equation (5).

[Equation 5]

$$T_i(t) = \sum_{j=0} \delta T_{ij} \tag{5}$$

Therefore, for each of a plurality of shots for forming the peripheral pattern 14, calculated is a temperature increase amount Ti(t) at the i-th shot position of interest and at the time t, which is generated due to heat transferred from each shot performed before the time t at which the shot concerned is performed. Thereby, for each of a plurality of shots for forming the peripheral pattern 14, a temperature increase amount Ti(t) at the time when a backscattered electron resulting from the shot concerned exposes the CD position of interest and at the CD position of interest can be obtained.

In the correlation parameter calculation step (S120), the correlation parameter calculation unit 78 calculates a correlation parameter B for defining the correlation among a width change amount ΔCD of the evaluation pattern 12, a temperature increase amount Ti(t) of the evaluation pattern 12, and a backscatter dose dj which reaches to the evaluation pattern 12, by using a width dimension CD of the evaluation pattern 12 under each writing condition, a temperature increase amount Ti(t) of the evaluation pattern 12 concerned at each shot for the peripheral pattern 14 under each writing condition, and a backscatter dose dj to the evaluation pattern 12 from each shot for the peripheral pattern 14 under each writing condition.

Figure 11:
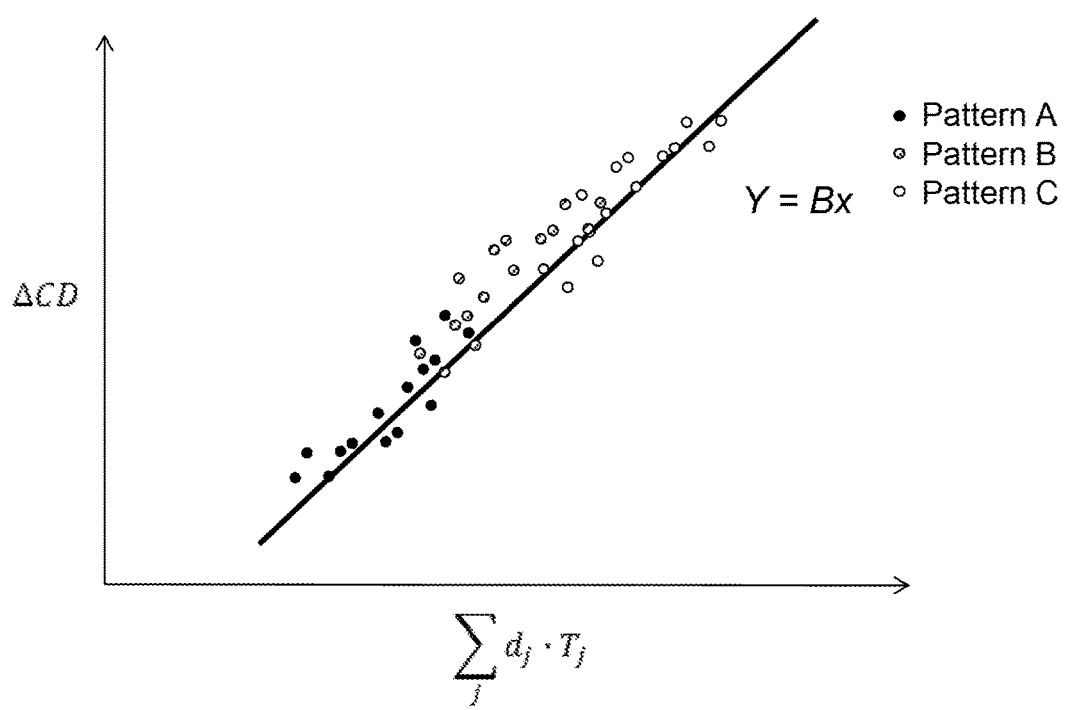
FIG. 11 shows an example of a model of correlation according to the first embodiment.

FIG. 11 shows an example of a model of correlation according to the first embodiment. In FIG. 11, the ordinate axis represents a width change amount ΔCD of the evaluation pattern 12 (CD position of interest, target CD position). The abscissa axis represents a sum Σdj·Tj of products each obtained by multiplying a backscatter dose dj, which is due to the j-th shot reaching to the shot position i of interest, by a temperature Tj at the shot position i of interest and at the time of the j-th shot. The temperature Tj at the shot position i of interest and at the time of the j-th shot is a temperature increase amount Ti (t) at the shot position of the i-th shot of interest and at the j-th shot time t, which has been increased because of all the shots previous to the j-th shot time t. Therefore, under each writing condition, the sum Σdj·Tj of dj·Tj with respect to each shot for forming the peripheral pattern 14 and the width change amount ΔCD of the evaluation pattern 12 (CD position of interest, target CD position) are approximated by an approximate expression. Here, for example, a primary expression is used for the approximation. The approximate expression can be defined by the following equation (6).

[Equation 6]

$$\Delta CD = B \sum_j d_j \cdot T_j \quad (6)$$

Therefore, the correlation parameter calculation unit 78 calculates a correlation parameter B (parameter for dose correction of electron beam) for defining the correlation shown by the approximate expression, by using Σdj·Tj and width change amount ΔCD under each writing condition. The calculated correlation parameter B is made to be related to a resist type so as to be output to the storage device 144 and stored therein. The correlation is not limited to a primary expression, and a second or higher order polynomial may also be used.

In the example described above, in order to obtain the correlation parameter B, the temperature Tj at the shot position i of interest is changed by variably changing the settling time. However, it is not limited thereto.

FIGS. 12A to 12C show another example of an evaluation pattern and a peripheral pattern according to the first embodiment. FIG. 12A shows an example of the evaluation pattern 12 and the peripheral pattern 14 surrounding the evaluation pattern 12. As shown in FIG. 12B, the distance between the evaluation pattern 12 and the peripheral pattern 14 can be changed by changing the inner side size of the peripheral pattern 14 of FIG. 12A. The values of dj and Tj can be variable by changing the distance between the evaluation pattern 12 and the peripheral pattern 14. Moreover, as shown in FIG. 12C, the values of dj and Tj can be variable by changing the dose used for writing the peripheral pattern 14 defined in the chip B.

Figure 13A:
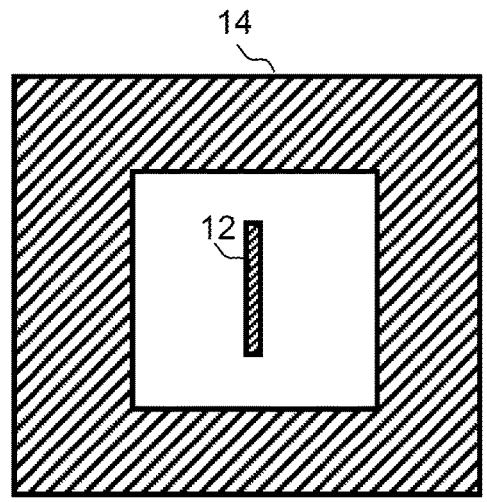
FIGS. 13A and 13B show another example of the evaluation pattern and the peripheral pattern according to the first embodiment.
Figure 13B:

FIGS. 13A and 13B show another example of the evaluation pattern and the peripheral pattern according to the first embodiment. The value of Tj can be variable by writing the evaluation pattern 12 defined in the chip A by each shot whose settling time is fixed in FIG. 13A, and making the settling time of each shot for forming the peripheral pattern 14 defined in the chip B variable in FIG. 13B.

Figures 14A, 14B:
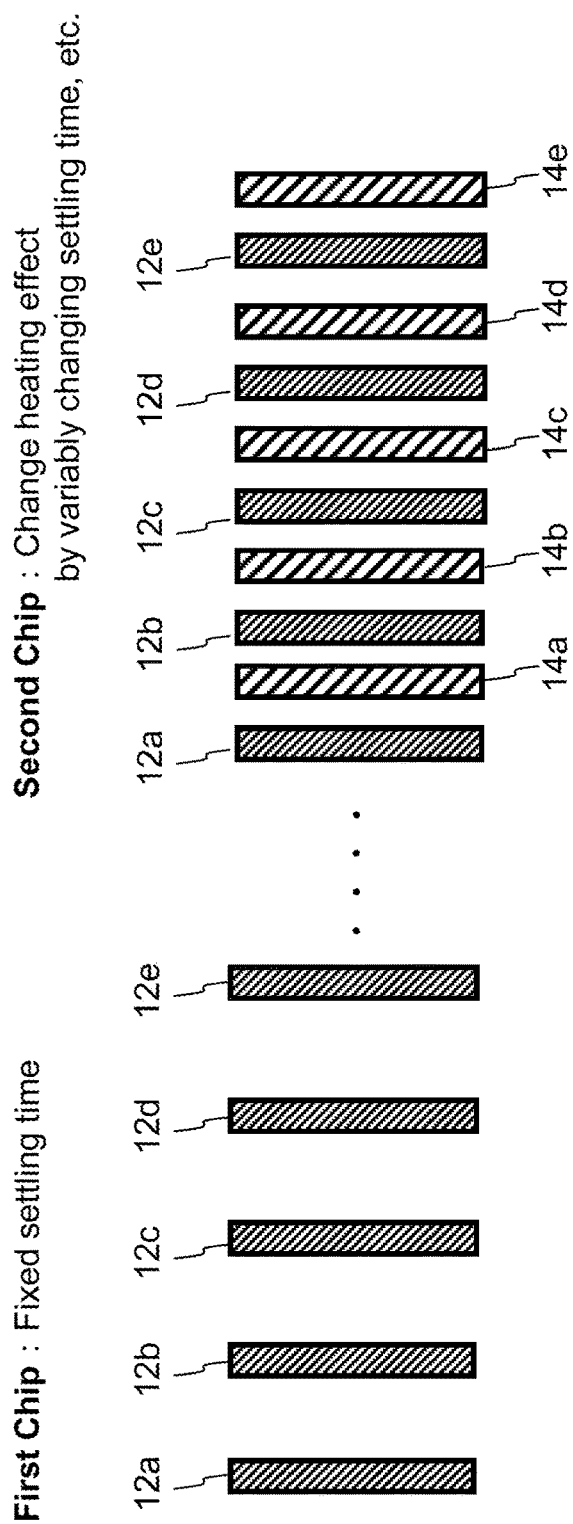
FIGS. 14A and 14B show another example of the evaluation pattern and the peripheral pattern according to the first embodiment.

FIGS. 14A and 14B show another example of the evaluation pattern and the peripheral pattern according to the first embodiment. Although the example described above shows the case where the combination of the evaluation pattern 12 and the peripheral pattern 14 surrounding the evaluation pattern 12 is used, the shape of the evaluation pattern 12 and the peripheral pattern 14 is not limited thereto. As shown in FIG. 14A, the evaluation patterns 12a to 12e may be configured as a plurality of line patterns extending in the same direction, and as shown in FIG. 14B, line patterns of the peripheral patterns 14a to 14e may be respectively arranged between the line patterns configuring the evaluation pattern 12. Even in this configuration, it is possible to variably change the values of dj and Tj.

Figure 15A:
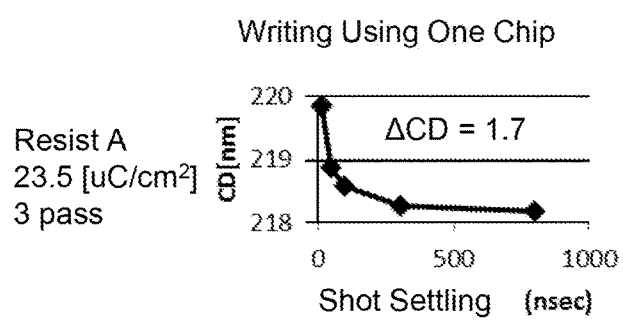
FIGS. 15A to 15F show an example of a width dimension depending on the type of resist according to the first embodiment.
Figure 15B:
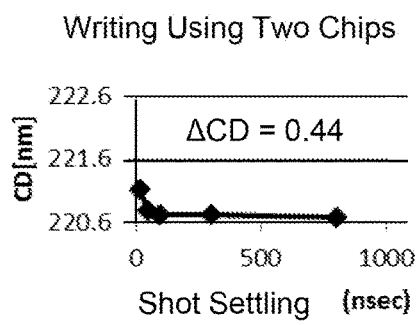

FIGS. 15A to 15F show an example of a width dimension depending on the type of resist according to the first embodiment. The relation between the width dimension CD and the settling time described in FIGS. 7A and 7B and FIGS. 8A and 8B are dependent on the type of resist. FIG. 15A shows an example of the relation between the width dimension of an evaluation pattern and the settling time according to the comparative example (2) to the first embodiment, where multiple writing of three passes is performed with the dose of 23.5 μC/cm², for example, using the resist A. FIG. 15B shows an example of the relation between the width dimension of an evaluation pattern and the settling time according to the first embodiment, where multiple writing of three passes is performed with the dose of 23.5 μC/cm², for example, using the resist A. If standardization is performed by dividing the maximum dimension change amount by the dose per pass, it is 0.217 nm/(μC/(cm²) in the case of using the resist A in the example of FIG. 15A. It is 0.056 nm/(μC/cm²) in the case of using the resist A in the example of FIG. 15B.

Figure 15C:
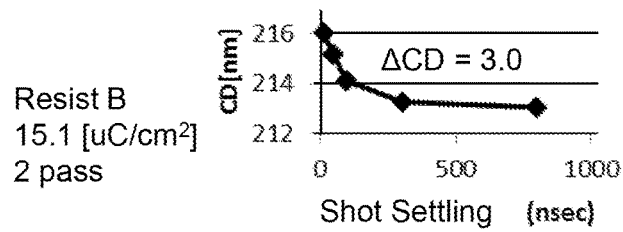
Figure 15D:
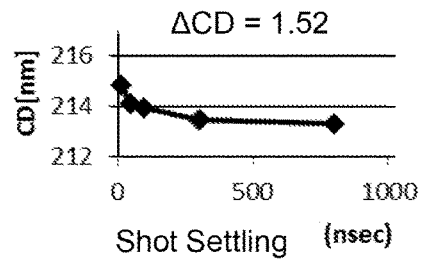

FIG. 15C shows an example of the relation between the width dimension of an evaluation pattern and the settling time according to the comparative example (2) to the first embodiment, where multiple writing of two passes is performed with the dose of 15.1 μC/cm², for example, using the resist B. FIG. 15D shows an example of the relation between the width dimension of an evaluation pattern and the settling time according to the first embodiment, where multiple writing of two passes is performed with the dose of 15.1 μC/cm², for example, using the resist B. If standardization is performed by dividing the maximum dimension change amount by the dose per pass, it is 0.397 nm/(μC/cm²) in the case of using the resist B in the example of FIG. 15C. It is 0.201 nm/(μC/cm) in the case of using the resist B in the example of FIG. 15D.

Figure 15E:
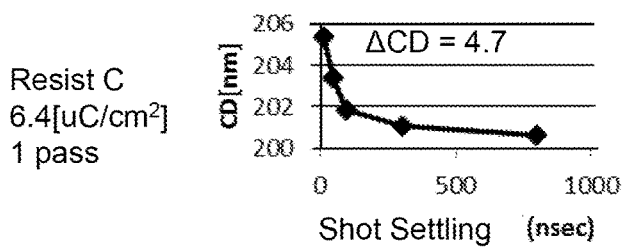
Figure 15F:
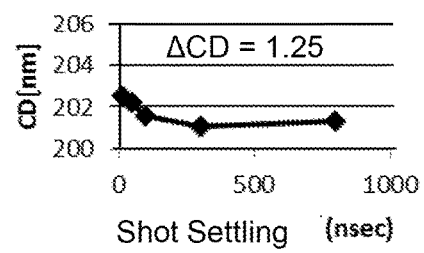

FIG. 15E shows an example of the relation between the width dimension of an evaluation pattern and the settling time according to the comparative example (2) to the first embodiment, where multiple writing of one pass (not multiplexed) is performed with the dose of 6.4 μC/cm², for example, using the resist C. FIG. 15F shows an example of the relation between the width dimension of an evaluation pattern and the settling time according to the first embodiment, where multiple writing of one pass (not multiplexed) is performed with the dose of 6.4 μC/cm², for example, using the resist C. If standardization is performed by dividing the maximum dimension change amount by the dose per pass, it is 0.734 nm/(μC/cm²) in the case of using the resist C in the example of FIG. 15E. It is 0.195 nm/(μC/cm²) in the case of using the resist C in the example of FIG. 15F.

As described above, the relation between the width dimension CD and the settling time depends on the type of resist. Therefore, according to the first embodiment, it is preferable to acquire a correlation parameter B for each resist type. The method for acquiring the correlation parameter B is what has been described above.

According to the first embodiment, as described above, it is possible to acquire, for each resist type, a correlation parameter B for performing dose correction for heating effect on backscattering. The correlation parameter B is made to be related to a resist type, and stored in the storage device 144.

Although, in the example described above, after measuring the width dimension CD, each calculation step up to calculating the correlation parameter B is performed in the writing apparatus 100, it is not limited thereto. It is also preferable to perform the calculation in an arithmetic device outside of the writing apparatus 100. In that case, the calculated correlation parameter B for each resist type is input from the outside of the writing apparatus 100, and stored in the storage device 144. In other words, there is stored, for each resist type, a correlation parameter B for a width change amount $\Delta$CD changed from a design dimension of a figure pattern (shot figure), a temperature increase amount Tj of the figure pattern (shot figure), and a backscatter dose dj reaching to the figure pattern (shot figure) in the storage device 144.

Next, a method of writing after performing dose correction for heating effect on backscatter by using the correlation parameter B will be described.

Figure 16:
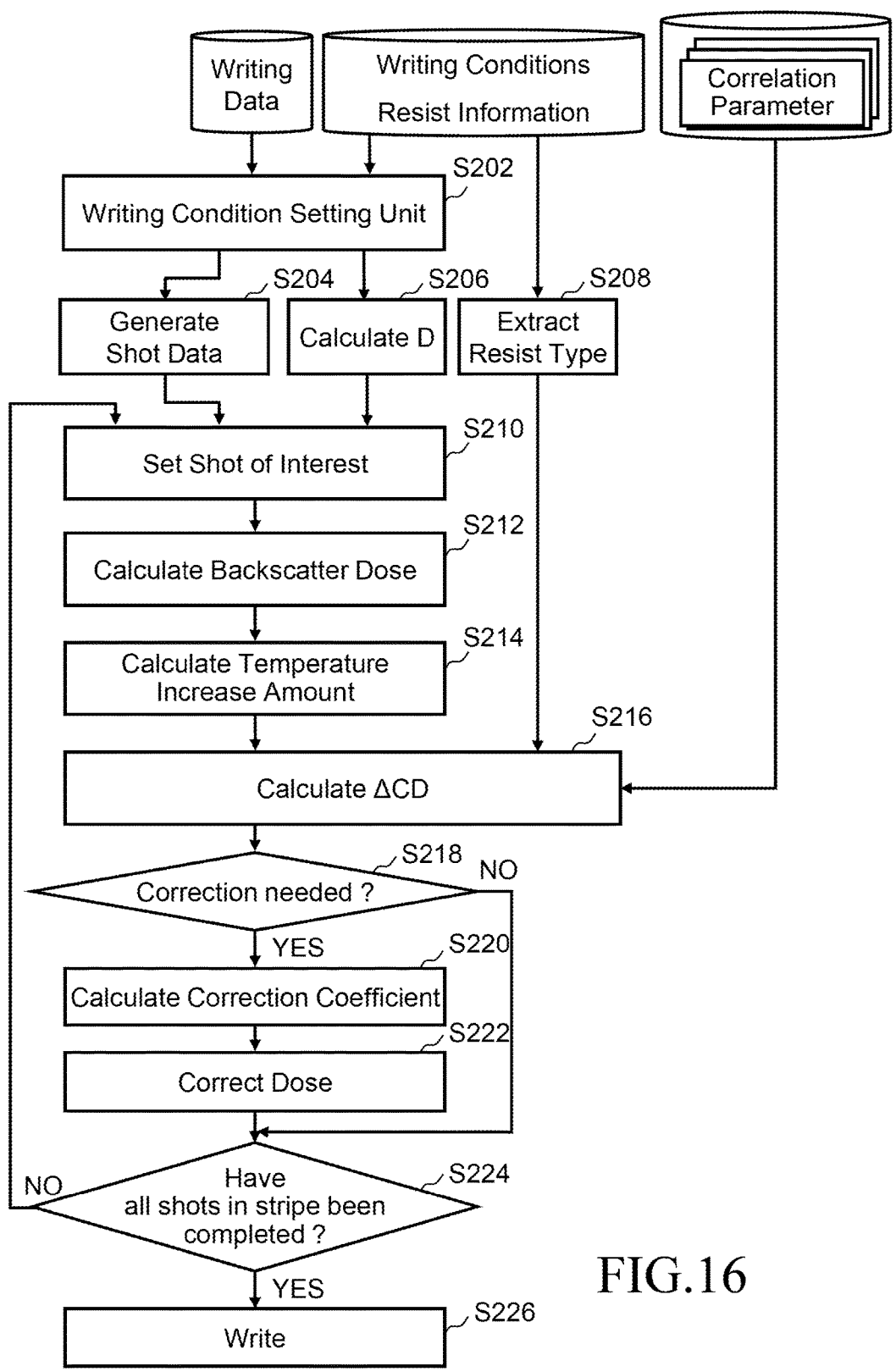
FIG. 16 is a flowchart showing main steps of a writing method according to the first embodiment.

FIG. 16 is a flowchart showing main steps of a writing method according to the first embodiment. As shown in FIG. 16, the writing method according to the first embodiment executes a series of steps: a writing condition setting step (S202), a shot data generation step (S204), a dose calculation step (S206), an extraction step (S208), a setting step (S210), a backscatter dose calculation step (S212), a temperature increase amount calculation step (S214), a $\Delta$CD calculation step (S216), a determination step (S218), a correction coefficient calculation step (S220), a dose correction step (S222), a determination step (S224), and a writing step (S226).

In the writing condition setting step (S202), the writing condition setting unit 50 reads writing condition information from the storage device 142, and sets, to the writing apparatus 100 (writing control unit 74, for example), writing conditions for writing a chip pattern (a plurality of figure patterns) defined in the writing data stored in the storage device 140. As an example of the writing conditions, settling time between a plurality of shots can be cited. Further, for example, a dose, the number of passes (multiplicity) of multiple writing, the order of writing of shots, the maximum shot size, etc. can be cited.

In the shot data generation step (S204), the shot data generation unit 52 reads out writing data from the storage device 140, and performs data conversion processing of several steps in order to generate shot data unique to the writing apparatus 100. The size of each figure pattern defined in the writing data is usually larger than the maximum shot size that can be shot by the writing apparatus 100, and in many cases it is impossible to form the figure pattern by one shot of the electron beam 200. Therefore, each figure pattern is divided into a plurality of shot figures each having the size equal to or less than the maximum shot size that can be shot of an electron beam. Then, shot data is generated for each shot figure. As the shot data, the figure code indicating the figure type of the shot figure concerned, coordinates to be irradiated with a shot, and the size of the shot figure are defined. Under the control of the writing control unit 74, each shot data is rearranged in the order of shots, and stored in the storage device 148. Shot data is calculated for each stripe region, for example.

In the dose calculation step (S206), the dose calculation unit 54 reads out writing data from the storage device 140, and calculates a dose D for each mesh region of a predetermined size. As the calculation method for obtaining the dose D, a conventional method can be used. The dose D can be calculated by multiplying a base dose Dbase by a correction coefficient. It is preferable to use as the correction coefficient, for example, a proximity effect correction coefficient. Since the influence radius (backscatter radius $\sigma$) of the proximity effect is several µm to 10 µm, it is preferable for the size of a mesh for correcting the fogging-effect to be approximately $\frac{1}{10}$ of the influence radius, for example, to be 0.5 µm to 1 µm in order to perform correction calculation. In addition, in order to correct the dose, it is also preferable to use an irradiation coefficient for the fogging effect correction, a correction coefficient for loading correction, etc. The dose calculation unit 54 generates a dose map in which each calculated dose is defined for each region. The generated dose map is stored in the storage device 148. The dose map is calculated for each stripe region, for example. In the dose map, each dose being a map value is preferably defined in the state having been converted into an irradiation time. The irradiation time can be defined by dividing a dose D by a current density J.

In the extraction step (S208), the resist information extraction unit 58 extracts, from the storage device 142, information on the type of resist coated on the target object 101 serving as a writing target substrate.

In the setting step (S210), the setting unit 56 sets a shot of interest (target shot) in the order of writing, for example.

In the backscatter dose calculation step (S212), the backscatter dose calculation unit 60 calculates a backscatter dose dj, which reaches to the shot position of the shot figure (figure pattern) of a shot of interest from each shot of a plurality of shots of the electron beam 200 in the case where the shot position of the shot figure of the shot of interest exists in the influence range of the proximity effect of each of the plurality of shots. As the method for calculating the backscatter dose dj, the equation (1) described above can be used. As the dose of each shot used for the calculation, the dose at the position concerned in the dose map stored in the storage device 148 is used. Further, as the backscatter dose dj reaching to the irradiation position of the shot of interest from the beam shot at the shot position irradiated previously to the shot of interest, it is more preferable to use a dose having been corrected in the dose correction step (S222) to be described later.

In the temperature increase amount calculation step (S214), the temperature increase amount calculation unit 62 calculates a temperature increase amount Tj at the shot position of the shot figure (figure pattern) of the shot of interest and at the time of the shot of interest, which is increased due to heat transferred from another shot, for each of a plurality of shots in the case where the shot position of the shot figure (figure pattern) of the shot of interest exists in the influence range of the proximity effect of each of the plurality of shots. Here, the "another shot" indicates all the shots having been performed at the time of shot whose backscattered electron reaches to the shot position of the shot of interest, regardless of the range of the proximity effect. However, a shot emitted from the position being too distant to transfer heat to the shot position of the shot of interest may be removed from the calculation targets. As the method for calculating the temperature increase amount Tj, the equations (2) to (5) described above should be used.

In the $\Delta$CD calculation step (S216), the $\Delta$CD calculation unit 64 reads out a correlation parameter B corresponding to an extracted resist type from the storage device 144 which stores, for each resist type, a correlation parameter B for the width change amount $\Delta$CD of a figure pattern, the temperature increase amount Tj of the figure pattern, and the backscatter dose dj reaching to the figure pattern, and when writing, using the electron beam 200, a figure pattern under the writing conditions (predetermined writing conditions)

having been set, calculates the width change amount ΔCD of the figure pattern concerned by using the correlation parameter B. Specifically, the ΔCD calculation unit 64 calculates the width change amount ΔCD of the shot figure (figure pattern) of the shot of interest, by using a temperature increase amount Tj at the shot position of the shot figure (figure pattern) of the shot of interest at each shot time of each shot whose backscattered electron reaches to the shot position of the shot of interest, a backscatter dose dj reaching from the shot concerned to the shot position of the shot figure (figure pattern) of the shot of interest at each shot time of each shot whose backscattered electron reaches to the shot position of the shot of interest, and a correlation parameter B. As the method for calculating a width change amount ΔCD, the equation (6) described above should be used.

In the determination step (S218), the determination unit 53 determines, using the width change amount ΔCD, whether it is necessary to correct the dose of the electron beam 200 of the shot of interest when writing, under the writing conditions (predetermined writing conditions) having been set, the shot figure (figure pattern) of the shot of interest by using the electron beam 200. Specifically, the determination unit 53 determines whether the calculated width change amount ΔCD of the shot figure (figure pattern) of the shot of interest is in an allowable range. If the calculated width change amount ΔCD is in the allowable range, it proceeds to the determination step (S224) without correcting the dose. If the calculated width change amount ΔCD is out (larger) of the allowable range, it proceeds to the correction coefficient calculation step (S220).

In the correction coefficient calculation step (S220), the correction coefficient calculation unit 68 calculates a correction coefficient k for correcting the dose of the electron beam for writing the shot figure (figure pattern) of the shot of interest when it is determined that correction of the dose is needed. The correction coefficient k is calculated so that the width change amount ΔCD of the shot figure (figure pattern) of the shot of interest which has been calculated using the correlation parameter B may be corrected.

Figure 17:
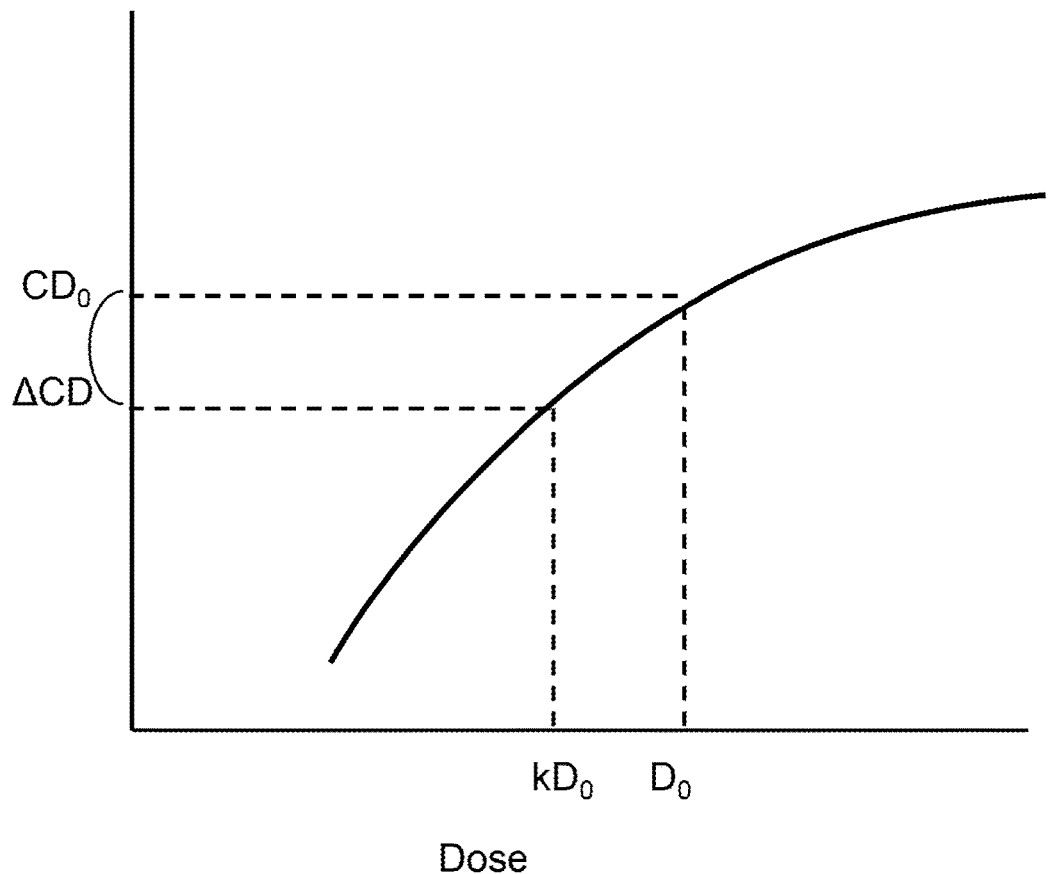
FIG. 17 shows an example of a relation between the width dimension and the dose according to the first embodiment.
Figure 18:
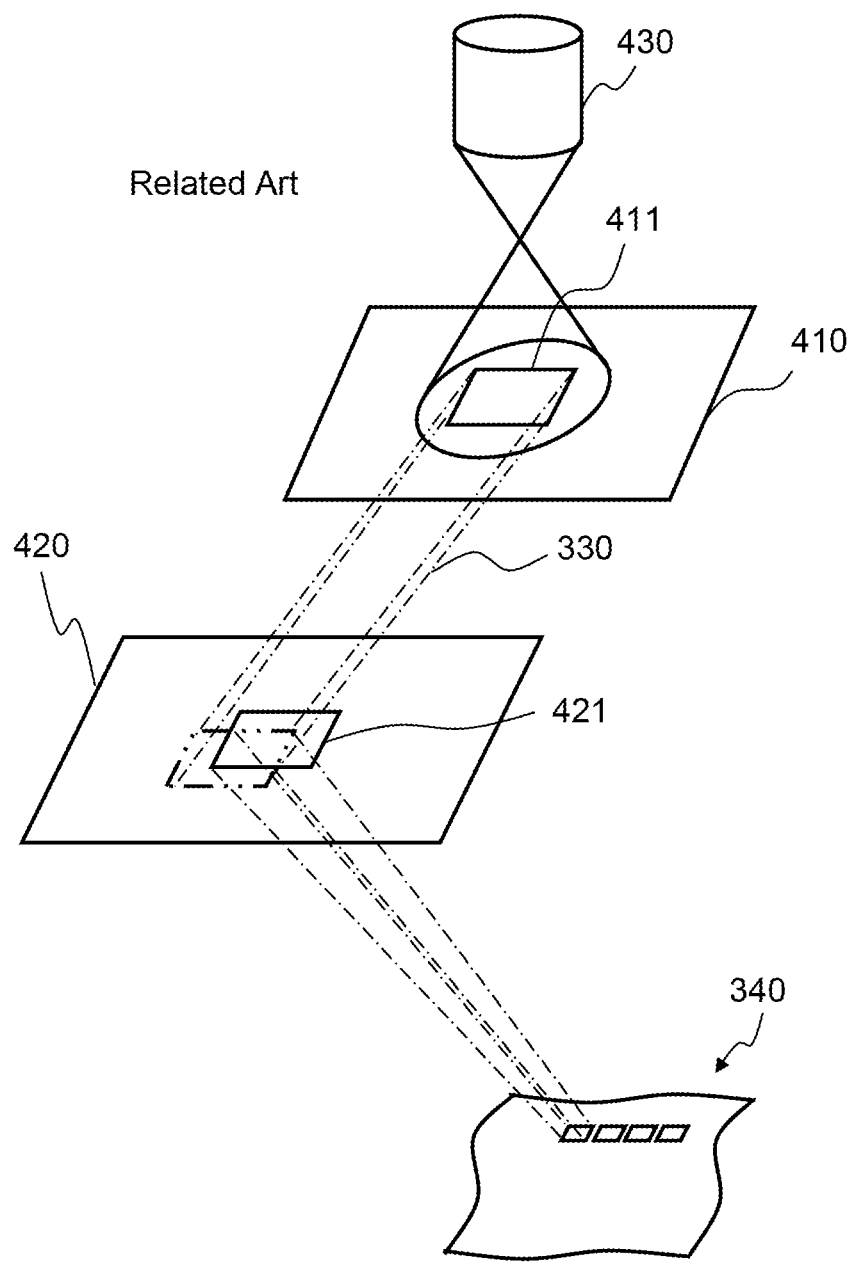
FIG. 18 is a conceptual diagram explaining operations of a variable-shaped electron beam writing apparatus.

FIG. 17 shows an example of a relation between the width dimension and the dose according to the first embodiment. In FIG. 17, the ordinate axis represents a width dimension CD, and the abscissa axis represents a dose D. The relation between the width dimension CD and the dose D can be obtained in advance by experiment etc. This relation should be obtained for each pattern density ρ. For example, it is recommended to obtain the relation with respect to the cases of ρ≈0, ρ=0.5 (50%), and ρ=1 (100%). Then, the relation in the case of an applicable pattern density should be obtained by linear interpolation. Then, the correction coefficient calculation unit 68 calculates a correction coefficient k by using which a dose $D_0$, having been calculated in the dose calculation step (S206) to form a width dimension $CD_0$ is corrected to a dose D ($=kD_0$) corresponding to the position obtained by correcting the width dimension $CD_0$ by the width change amount ΔCD.

In the dose correction step (S222), the correction unit 70 corrects, using the correction coefficient k, the dose D of the electron beam 200 for writing the shot figure (figure pattern) of the shot of interest. The corrected dose D is overwritten in the dose map stored in the storage device 148. The size of the map value of the dose map is set to be larger than the shot size. Therefore, different doses may be defined with respect to the same map value. Thus, the dose for each shot position is to be defined as attribute data for each map value.

In the determination step (S224), the determination unit 72 determines whether each calculation processing from the setting step (S210) to the dose correction step (S222) described above has been completed for all the shots in the stripe region concerned. When having been completed, it proceeds to the writing step (S226). When there remains a shot before being processed, it returns to the setting step (S210), and each step from the setting step (S210) to the determination step (S224) is repeated until calculation processing has been completed for all the shots.

In the writing step (S226), the writing unit 150 writes, under the writing conditions (predetermined writing conditions) having been set, the shot figure (figure pattern) of each shot on the target object 101 (substrate) by using the electron beam 200 of the corrected dose. Specifically, it operates as described below. The deflection control circuit 120 acquires an irradiation time from the dose map stored in the storage device 148. Then, the deflection control circuit 120 outputs a digital signal for controlling the irradiation time of each shot to the DAC amplifier unit 130. The DAC amplifier unit 130 converts the digital signal into an analog signal to be amplified and applied as a deflection voltage to the blanking deflector 212.

With respect to the electron beam 200 emitted from the electron gun 201 (emitter), when passing through the blanking deflector 212, it is controlled to pass through the blanking aperture 214 by the blanking deflector 212 when in the beam ON state, and the whole of it is deflected to be blocked by the blanking aperture plate 214 when in the beam OFF state. The electron beam 200 that has passed through the blanking aperture plate 214 during the period from changing a beam OFF state to a beam ON state to changing the beam ON state to a beam OFF state serves as one shot of the electron beam. The blanking deflector 212 controls the direction of the passing electron beam 200 to alternately generate a beam ON state and a beam OFF state. For example, when in a beam ON state, no voltage is applied to the blanking deflector 212, and, when in a beam OFF state, a voltage should be applied to it. The dose per shot of the electron beam 200 to irradiate the target object 101 is adjusted depending upon the irradiation time of each shot.

As described above, each shot of the electron beam 200, generated by passing through the blanking deflector 212 and the blanking aperture plate 214, irradiates the whole of the first shaping aperture plate 203 which has a quadrangular opening by the illumination lens 202. At this stage, the electron beam 200 is first shaped to a quadrangle. Then, after passing through the first shaping aperture plate 203, the electron beam 200 of the first aperture image is projected onto the second shaping aperture plate 206 by the projection lens 204. The first aperture image on the second shaping aperture plate 206 is deflection-controlled by the deflector 205 so as to change (variably shape) the shape and size of the beam. Such variable beam shaping is performed for each shot, and, generally, each shot is shaped to have a different shape and size. Then, after passing through the second shaping aperture plate 206, the electron beam 200 of the second aperture image is focused by the objective lens 207, and deflected by the main deflector 208 and the sub deflector 209 to reach a desired position on the target object 101 placed on the XY stage 105 which moves continuously. As described above, a plurality of shots of the electron beam 200 are deflected in order, by each deflector, onto the target object 101 serving as a substrate.

As described above, according to the first embodiment, it is possible to acquire a parameter B for performing dose correction for heating effect of backscattering. Therefore, patterns can be written in highly precise dimensions.

Embodiments have been explained referring to specific examples described above. However, the present invention is not limited to these specific examples.

While the apparatus configuration, control method, and the like not directly necessary for explaining the present invention are not described, some or all of them can be selectively used on a case-by-case basis when needed. For example, although description of the configuration of the control unit for controlling the writing apparatus 100 is omitted, it should be understood that some or all of the configuration of the control unit can be selected and used appropriately when necessary.

In addition, any other method of acquiring a parameter for performing dose correction of a charged particle beam, charged particle beam writing method, and charged particle beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing method comprising:
extracting information on a type of resist coated on a writing target substrate;
reading out a corresponding correlation parameter which corresponds to the resist of an extracted type from a storage device which stores, for each type of the resist, a correlation parameter for a width dimension change amount of a figure pattern, a temperature increase amount of the figure pattern, and a backscatter dose reaching the figure pattern, and calculating the width dimension change amount of the figure pattern by using the correlation parameter when writing the figure pattern under a predetermined writing condition by using a charged particle beam;
determining, using the width dimension change amount, whether it is necessary to correct a dose of the charged particle beam when writing, under the predetermined writing condition, the figure pattern by using the charged particle beam;
calculating a correction coefficient for correcting the dose of the charged particle beam for writing the figure pattern when it is determined that correction of the dose is needed;
correcting, using the correction coefficient, the dose of the charged particle beam for writing the figure pattern; and
writing, under the predetermined writing condition, the figure pattern on the writing target substrate by using the charged particle beam of the dose having been corrected.

2. The method according to claim 1, further comprising:
calculating the backscatter dose which reaches a shot position of the figure pattern from each of a plurality of shots of the charged particle beam in a case where the shot position of the figure pattern exists in an influence range of a proximity effect due to the each of the plurality of shots; and
calculating the temperature increase amount at the shot position of the figure pattern, which is increased due to heat transferred from another shot, at each shot time of the plurality of shots, wherein
the width dimension change amount of the figure pattern is calculated using the temperature increase amount at the shot position of the figure pattern at the each shot time, the backscatter dose reaching from a shot concerned at the each shot time to the shot position of the figure pattern, and the correlation parameter, and
the correction coefficient is calculated so that the width dimension change amount of the figure pattern which has been calculated using the correlation parameter is corrected.

3. The method according to claim 1, wherein
the backscatter dose and the temperature increase amount at the shot position of the figure pattern at reaching time of the backscatter dose are calculated whenever the backscatter dose resulting from another shot reaches the shot position of the figure pattern, and
the width dimension change amount of the figure pattern is calculated using a sum of products of the backscatter dose with respect to all of the another shot whose backscatter dose reaches the shot position of the figure pattern, and the temperature increase amount at the reaching time.

* * * * *